United States Patent [19]
Scheerer et al.

[11] Patent Number: 5,327,137
[45] Date of Patent: Jul. 5, 1994

[54] MULTIPLE RAMP PROCEDURE WITH HIGHER ORDER NOISE SHAPING

[76] Inventors: Joachim Scheerer, Am Fort Weisenau 38, D-6500 Mainz 1; Hartmut Grützediek, An der Klosterheck 16, D-6500 Mainz 43, both of Fed. Rep. of Germany

[21] Appl. No.: 45,576

[22] Filed: Apr. 9, 1993

[30] Foreign Application Priority Data

Apr. 15, 1992 [DE] Fed. Rep. of Germany ....... 4212546

[51] Int. Cl.$^5$ .............................................. H03M 1/50
[52] U.S. Cl. ..................... 341/168; 341/166
[58] Field of Search ............... 341/155, 166, 167, 168, 341/169, 170

[56] References Cited

U.S. PATENT DOCUMENTS 4,361,831  11/1982  Grutzediek et al. ............... 341/168
5,066,955  11/1991  Scheerer et al. ..................... 341/168

OTHER PUBLICATIONS

A. Klauer & M. Pandit, "Processing measurement signals with High-resolution AD-conversion," in *Technisches Messen,* Nov. '85, kpp. 404-410.

*Primary Examiner*—Brian K. Young
*Attorney, Agent, or Firm*—Frishauf, Holtz, Goodman & Woodward

[57] ABSTRACT

An analog-to-digital converter operates according to the multiple ramp procedure with continuous integration of the input signal in a charge storage or charge summation circuit, whereby downward integration is performed at periodically recurrent time intervals with the aid of a comparator circuit at the output of the charge storage or charge summation circuit, a logic circuit, a clock oscillator, a switching circuit, a first reference signal and a second reference signal. Hereby the duration of the switched-on state of one of the reference signals is a measure for the input signal. The transfer function of the quantization noise $H_q(z)$ with an n-th order $(n = 1,2,3, \ldots)$ high pass filter characteristic can be derived from a transfer function $H(z)$ describing the specified configuration.

14 Claims, 18 Drawing Sheets

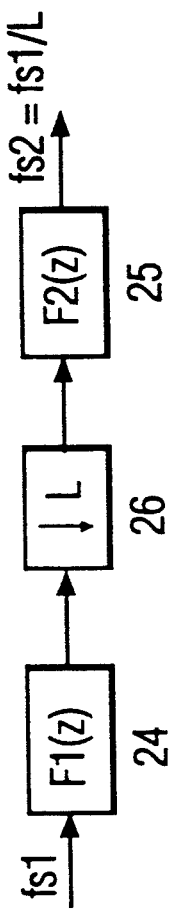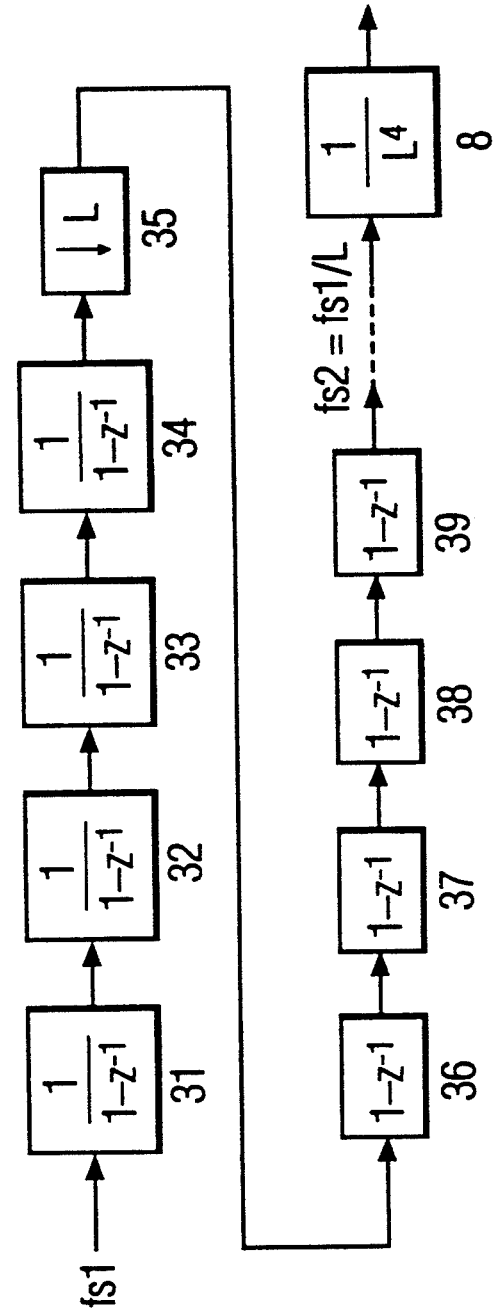
FIG. 10
FIG. 11

MULTIPLE RAMP PROCEDURE WITH HIGHER ORDER NOISE SHAPING

CROSS-REFERENCE

Cross-reference to related patents, the disclosures of which are hereby incorporated by reference:
Ref. 1) U.S. Pat. No. 4,361,831;
Ref. 2) U.S. Pat. No. 5,066,955.
Cross-reference to other patent and scientific publications:
Ref. 3) DE 28 20 601;
Ref. 4) DE 39 21 976;
Ref. 5) Manfred Seifert, Analoge Schaltungen (Analog Circuits), 3rd edition, Hüthig Verlag Heidelberg 1990, ISBN 3-7785-1862-3. p. 520 ff, p. 216;
Ref. 6) J. J. Achenbach, System-Synthese: Grundlagen der Synthesemethoden kontinuierlicher und diskreter Systeme und Filter füur die Praxis (System Synthesis: The principles of methods for synthesising continuous and discrete systems and filters for practical purposes), VDI-Verlag, Düsseldorf, 1988, p. 325 ff;
Ref. 7) A. Klauer M Pandit Me β signalverarbeitung mit hochauflösender AD-Wandlung (Measuring signal processing with high resolution analog-to-digital conversion), Technisches Messen, Nov. 1985, pp. 404–410;
Ref. 8) Handbook of Digital Signal Processing, edited by D. F. Elliot, Academic Press, Inc., San Diego 1987, ISBN 0.12-237075-9;
Ref. 9) A. V. Oppenheim, R. W. Schafer, DISCRETE-TIME SIGNAL PROCESSING, Prentice Hall, Englewood Cliffs, N.J., 1989, ISBN 0-13-216292-X, chapter 6.4.

FIELD OF THE INVENTION

The invention involves analog-to-digital converters operating according to the multiple ramp procedure with continuous summation/integration of the input signal via a sum or difference circuit into a charge storage or charge summation circuit with a comparator circuit following after the charge storage or charge summation circuit, whereby at periodically recurring time intervals, with the aid of a logic circuit, a clock oscillator and a switching device, a first reference signal is connected to the same or another input of the charge storage or charge summation circuit, and at the same time or with a predefined fixed displacement in time, a second already connected reference signal is disconnected. Transit of the switching threshold of comparator circuit produces a comparator output signal which, via the logic circuit which evaluates it and via the analog switch control lines, switches off the first reference signal again on the next edge at the output of a clock oscillator or with a predefined delay time after the next edge at the output of a clock oscillator, and at the same time or with a predefined fixed time displacement with respect thereto reconnects the second reference signal, whereby in simple versions of the invention the first or the second reference signal may be zero, with a Nth order low pass filter characteristic, $N \geq 1$, of the resulting transfer function $H(z)$ describing this configuration, whereby the duration of the switched-on state of the first or second reference signal in the settled state, ignoring quantization noise, is a linear function of the input signal and thus a measure for the input signal.

BACKGROUND

Analog-to-digital converters of this kind are known for example through the patents DE 28 20 601, and corresponding U.S. Pat. No. 4,361,831, DE 39 21 976 and corresponding U.S. Pat. No. 5,066,955. Due to their continuous integration of the input signal in time, i.e. integration without any need to switch the input signal, these procedures are especially suitable for highly accurate and stable analog-to-digital conversion. Furthermore, a class of one bit analog-to-digital converters is known, the so-called delta sigma converters, which aroused interest specially for digital voice signal processing in conjunction with frequency-dependent shaping of the quantization noise followed by digital filtering. The disadvantages of the latter procedure are the poor long-term and short-term stability and temperature drift caused mainly by the frequent switching, and the relatively large background noise level.

Both groups have in common the possibility of distributing the quantization noise power over a large frequency range by oversampling the input signal with a sampling frequency greater than the Nyquist frequency resp. Nyquist rate (cf. Ref. 8, p.209). This gives the opportunity of removing a large fraction of this noise power subsequently by digital low pass filtering (Ref. 5, Ref. 2 and Ref. 7).

SUMMARY OF THE INVENTION

It is the purpose of this invention, on the basis of the multiple ramp procedures as described in DE 28 20 601, U.S. Pat. No. 4,361,831, DE 39 21 976 and U.S. Pat. No. 5,066,955 (Ref. 1, Ref. 3, Ref. 4 and Ref. 2), with their advantages with regard to long-term and short-term stability and temperature stability as well as minimized background noise, to specify a means for optimising the procedure with regard to higher resolution and/or shorter measuring time.

Furthermore, applying the transposition theorem of Mason from analysis of the signal processing flow charts (cf. Ref. 9), the invention is intended to give a further family of multiple ramp procedures with similar advantages and incorporating multiple downward integration, i.e. those multiple ramp procedures in which, in addition to downward integration of the first integrator of the charge storage or charge summation circuit, convergence accelerating signals are applied to further integrators in the circuit, these signals being proportional to the comparison or reference signals applied by the switching configuration.

The purpose of the invention is implemented by an analog to digital converter according to the multiple ramp procedure with continuous summation or integration of the input signal via a summation or difference circuit in a charge storage or charge summation circuit, with a comparator circuit following after the charge storage or charge summation circuit, whereby at periodically recurrent time intervals, with the aid of a logic circuit, a clock oscillator and a switching circuit, at the same or at another input of the charge storage or charge summation circuit (2), a first reference signal is connected and at the same time or with a predefined fixed time displacement a second already connected reference signal is disconnected, the crossing of the switching threshold of the comparator circuit produces a comparator output signal which, via the logic circuit evaluating it and via the analog switching control lines disconnects the first reference signal again on the next edge or with a predefined delay after the next edge at the output of a clock oscillator and at the same time or with a predefined fixed time displacement with respect thereto connects the second reference signal again, whereby in simple versions of the invention the first or the second reference signal can be zero, with an Nth order, $N \geq 1$, low pass filter characteristic of the resulting transfer function H(z) describing this configuration, whereby the duration of the switched on state of the first or second reference signal in the settled down state and neglecting the quantisation noise, is a linear function of the input signal, characterised by the feature that the transfer function of the quantisation noise $H_q(z)$ derivable from the stated transfer function H(z) has a high pass filter characteristic.

In this invention, the input signal is continuously integrated by a charge storage or charge summation circuit. A comparator circuit follows after the charge storage or charge sun, nation circuit. At periodically recurrent time intervals, with the aid of a logic circuit, a first reference signal is connected and a second already connected reference signal is disconnected at the same or at another input of the charge storage or charge sun, nation circuit or at a sum or difference circuit interposed on the input side. As soon as the output voltage of the charge storage or charge summation circuit has passed through the comparator threshold, the logic circuit evaluating the comparator output signal causes the first reference signal to be switched off again and the second reference signal to be switched on again, on the next edge or with a predefined time delay after the next edge at the output of a clock oscillator. Hereby the first or the second reference signal can be zero in simple versions of the invention.

A charge storage or charge sun, nation circuit is here understood to mean an analog circuit consisting of a configuration of active and passive components which are connected up such that they have a Nth order (N greater than or equal to 1) low pass filter characteristic, and providing, together with a comparator on the output side and the mean reference signal in the feedback loop path, an overall loop gain which does not produce a tendency toward oscillation; the transfer function for the quantization noise derivable from the specified transfer function has a high pass characteristic with greatest possible suppression of the quantization noise in the frequency range of the low frequency input signal which is to be converted, in other words, the circuit manifests a high order of noise shaping, and the input stage of the charge storage or charge sun%marion circuit does not distort the value of the charge which is stored in its integrating section and which is proportional to the input signal. Sun, nation of the input signal and of the reference voltages is here understood to mean that the input stage stores charges which are proportional to these signals. Thus, in the simplest case, this circuit is an integrator.

The periodically recurrent time intervals mentioned above define, in each case, a so-called start of a submeasurement and the time between successive such sub-measurements. The duration of the switched on state of the first or second reference signal is a measure for the input signal. The sequence of sub-measurement results thus constitutes an oversampled sequence of measurement results for the input signal. The degree of oversampling is given by the ratio of the rate of sub-measurements to the Nyquist frequency of the input signal which is to be digitized.

As mentioned in Ref. 2 and 7, the individual sub-measurement results can be largely freed from quantization noise lying above the filter cut-off frequency by simple summation, i.e. moving average formation or by comb filters, by multiple comb filters or, quite generally, by higher order digital low pass filters. In order that this shall be satisfactorily successful, the order of the filter should be at least one greater than the order of the charge storage or charge sun, nation circuit. Since the chiefly white quantization noise obtains, on the one hand, a high pass filter characteristic, through the transfer function of the quantization noise derivable from the stated transfer function, with greatest possible suppression of the quantization noise in the frequency band of the low frequency signal which is to be digitized, and, on the other hand, the oversampling distributes the quantization noise power over a frequency band broadened according to the degree of oversampling, a distinct reduction of the quantization noise power is obtained after the digitization in the signal frequency band of interest which lies towards low frequencies. This means that a higher resolution and/or a higher measuring rate of the analog-to-digital converter is obtained.

However, because in the simple multiple ramp process the loop gain is displaced parallel to the frequency axis in the Bode diagram (Ref. 5) with increasing input signal, as from a certain input signal drive level depending on the filter order of the charge storage or charge summation circuit, the 0 dB intercept is passed through with a slope smaller than or equal to $-40$ dB/decade, so that the circuit then becomes unstable. This input signal drive dependency of the frequency characteristic can be suppressed partially or completely by directly or indirectly superimposing so-called convergence accelerating signals on the comparator input signal, thus enforcing convergence in the presence of fluctuations of the input signal. The convergence accelerating signals depend on the input signal and/or time and/or the reference voltages, and their Taylor series expansions with respect to time are a first or higher order polynomial in the time interval of one sub-measurement. Convergence accelerating signals as known from Ref. 4 and Ref. 2 are understood to be convergence accelerating signals which produce a greatly increased convergence region, ensure rapid convergence and which are devised such that their Taylor series expansions with respect to time are first or higher order polynomials within the time interval of a sub-measurement. Signals of this kind are called "convergence accelerating signals" in the following text.

In order that the process shall regain a proper state within a reasonable time after switch-on or after overdrive, it is appropriate to limit the individual stages of the charge storage or charge summation circuit to a maximum drive level.

A modification of the invention with improved transient response of the analog-to-digital converter is obtained by applying the signal inversion or transposition theorem of Mason from the theory of linear signal flow diagrams (cf. Ref. 9), to the results described above. Instead of the converters with single downward integration as described above, this leads to converters with multiple downward integration and equivalent noise shaping.

For example, the charge storage or charge summation circuit in the converters described above can consist of a cascade configuration of N (N=1, 2, 3, ...) integrators, whose individual output signals are added with different weight factors to give the output signal of the charge storage or charge summation circuit which is applied as input signal to the comparator. From this, the transposition theorem gives a circuit consisting of N integrators, in which each of the N integrators individually, and with the corresponding weight factors with which the individual integrator outputs are added together in the original circuit to give the comparator input signal, switches a first reference signal on and a second already connected reference signal off at periodically recurrent time intervals with the aid of a logic circuit. As soon as the output voltage of the Nth integrator has crossed the comparator switching threshold, the logic circuit evaluating the comparator output signal causes the weighted first reference signals to be switched off again and the second ones to be switched on again, on the next edge or with a predefined delay time after the next edge at the output of a clock oscillator. Here too, in simple versions of the invention the first or the second reference signal may be zero. The transposition theorem can also be applied to parts of a circuit according to the procedure of single downward integration, giving circuits with Nth order noise shapings and (N-M) integrator inputs (N greater than or equal to M greater than or equal to one) at which reference signals are switched.

BRIEF FIGURE DESCRIPTION

The invention will now be described in detail with the aid of embodiments illustrated in the following drawings:

FIG. 2b shows examples of possible implementations of the individual components of FIG. 2a;

FIG. 4b shows a preferred implementation according to FIG. 4a;

FIG. 8 shows a third implementation form for a third order noise shaping according to FIG. 7a;

FIG. 10 shows a generalized filter configuration with decimator;

FIG. 11 shows a fourth order comb filter with L coefficients and decimation by the factor L;

FIG. 13 shows a third order analog-to-digital converter with multiple downward integration by additional convergence accelerating signals $i'_{ca}$ and $i''_{ca}$ and $H_q(z)$ similar to FIG. 7a.

DETAILED DESCRIPTION

Figure 1:
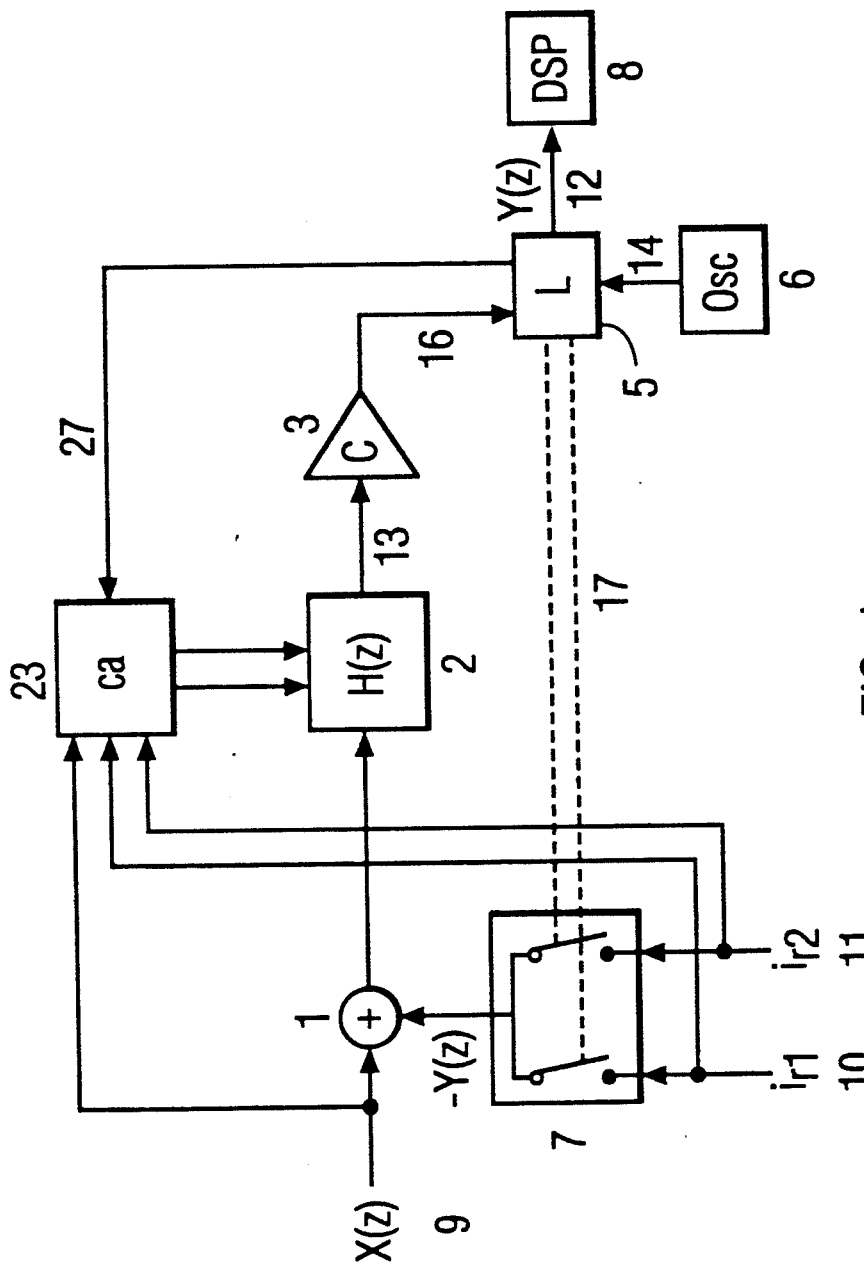
FIG. 1 shows the block diagram for single downward integration.

As shown in FIG. 1, in procedures of this invention with single downward integration, the input signal 9 is summed continuously in a charge storage or charge summation circuit 2 via a sum or difference circuit 1. Additionally one or several convergence accelerating signals $i_{ca1}, \ldots, i_{ca(N+1)}$ from one or several sources for convergence accelerating signals 23 and of the type as defined above and described in U.S. Pat. No. 5,066,955, can be applied at the input and/or in the middle section and/or at the output of the charge storage or charge summation circuit 2, as shown in detail in FIG. 2a and FIG. 2b. After the charge storage or charge summation circuit 2 follows a comparator circuit 3. At periodically recurrent time intervals, with the aid of a logic circuit 5, a clock oscillator 6 and a switching circuit 7, a first reference signal $i_{r1}$ 10 is connected and at the same time or with a predefined fixed time displacement with respect thereto a second already connected reference signal $i_{r2}$ 11 is disconnected, at the same or at another input of the charge storage or charge summation circuit 2, whereby k: $i_{r2} = -k \cdot i_{r1}$. After the output voltage of the charge storage or charge summation circuit 13 has crossed the switching threshold of the comparator circuit 3, the logic circuit 5 evaluating the comparator output signal 16, acting via the analog switching control lines 17, causes the first reference signal $i_{r1}$ 10 to be switched off again and, at the same time or with a predetermined fixed time displacement with respect thereto, the second reference signal $i_{r2}$ 11 to be switched on again, on the next edge or with a predefined delay time after the next edge 14 at the output of a clock oscillator 6. Hereby the first reference signal 10 or the second reference signal 11 can be zero in simple implementations of the invention.

Figure 2A:
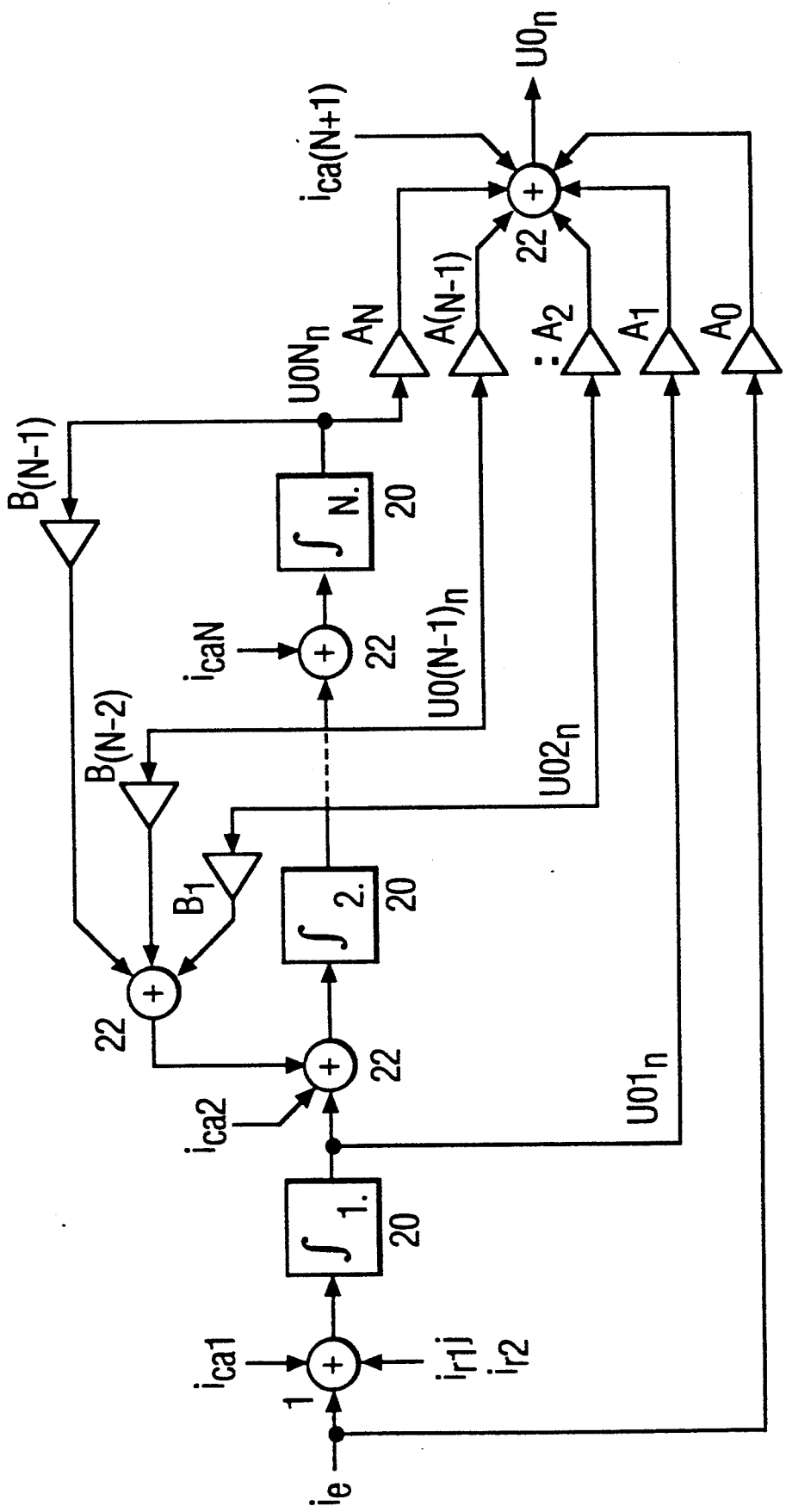
FIG. 2a shows an example of a charge storage or charge summation circuit 2, together with a sum or difference circuit 1.
Figure 2B:
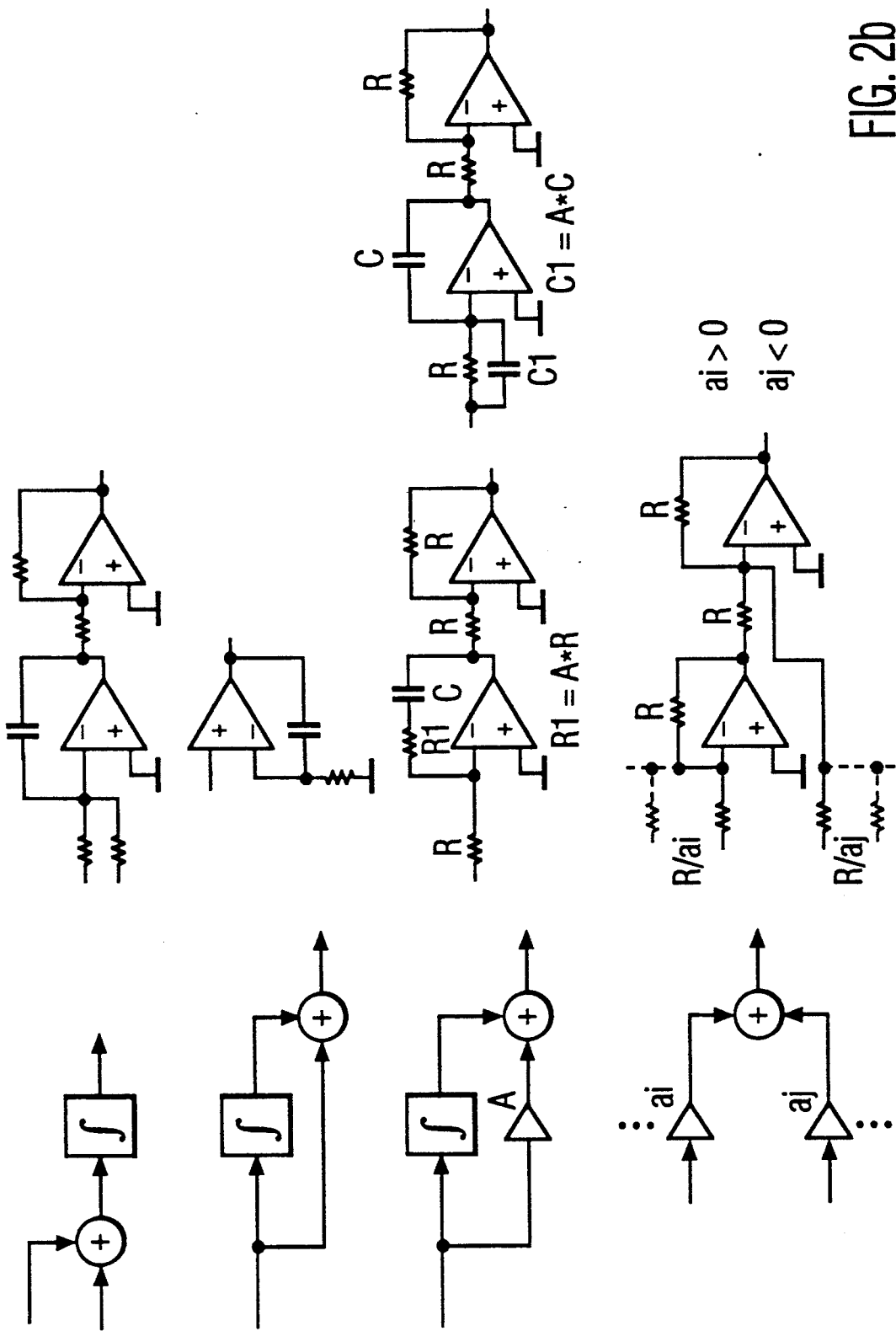

FIG. 2a shows an example of a charge storage or charge summation circuit 2 and FIG. 2b shows some examples of possible implementations of the individual components of FIG. 2a. The charge storage or charge summation circuit 2 is here and in the following text understood to be a configuration of amplifiers which are connected up such that they fulfill the following requirements:

a) The resultant transfer function H(z) describing this configuration has an Nth order low pass filter characteristic (N≧1) such that H(z) together with the subsequent further gain, represented by the comparator and the mean reference signal value serving as loop feedback, constitutes a transfer function whose poles lie within the unit circle in the z plane.

b) The transfer function of the quantization noise $H_q(z)$ derivable from the stated transfer function according to the equation (4) stated below, has a high pass filter characteristic with greatest possible suppression of quantization noise in the frequency spectrum of the low frequency input signal which is to be digitized. Since, as will be shown later, an important parameter for this is the number of cascaded integrators, for simplicity this number is here called the order of the noise shaping.

c) The input stage of the charge storage or charge summation circuit 2 must have, on the one hand, an integrating component, in order to provide on the average in time for charge equilibrium between the charges, proportional to the input signal and to the reference signals. On the other hand, the gain of the input stage can also have proportional and differential components, as long as these are implemented such that they do not distort the value of the charge stored in the integrating component which is proportional to the input signal. With a conventional inverting integrator consisting of an operational amplifier, an input resistor and a feedback capacitor, this could be effected, for example, with a resistor in series with the feedback capacitor and a capacitor in parallel with the input resistor. Summation of the input signal and reference voltages is here understood to mean that the input stage stores charges proportional to these signals. Thus it is an integrator in the simplest case. Furthermore, the charge storage or charge summation circuit 2 has several injection points (cf. FIG. 2a) for convergence accelerating signals $i_{cal}, \ldots, i_{ca(N+1)}$ at the input and/or between its individual stages and/or at the output. The injection points between the individual stages, as depicted in FIG. 2a, can lie after or before the taps for the $A_i$ shown there. Preferred embodiments of the charge storage or charge summation circuit 2 also contain stages for amplitude limiting of the signals of the individual amplifiers and integrators contained therein, to values which are only slightly greater than the respective drive range in the respective settled state, in order to give faster settle-down after a possible overdrive.

The fact that FIG. 2a and other drawings contain several integrators 20, several further sum or difference circuits 22 and in some cases also several sources for convergence accelerating signals $i_{ca}$ 23 as well as several logic control signals 27 for the sources of the convergence accelerating signals 23, is intended to improve synoptical clarity and to emphasize that these are functionally equivalent but not necessarily identically constructed circuit sections.

Each of the periodically recurrent time intervals mentioned above defines a so-called sub-measurement and its start a so-called start of a sub-measurement. The time separation of the periodically recurrent time events, i.e. the duration of a sub-measurement, and the measurement of the duration of the connected state of the first reference signal 10 or the second reference signal 11, can be determined conveniently by direct counting of the edges 14 at the output of the clock oscillator 6 or of another oscillator, e.g. a microprocessor clock or even indirectly via the execution time of a microprocessor subroutine. Accordingly, it is also possible to implement the entire logic circuit 5 with a microprocessor and a software program running on this micro-processor. According to U.S. Pat. No. 5,066,955, the duration of the switched on state of the first reference signal 10 or the second reference signal 11 in the settled state and ignoring quantization noise, is a linear function of the input signal 9 and thus a measure for the input signal 9. Thus the sequence of sub-measurement results is an oversampled sequence of measurement results for the input signal. The degree of oversampling is given as the ratio of the rate of sub-measurements to the Nyquist frequency of the input signal which is to be digitized.

Figure 3:
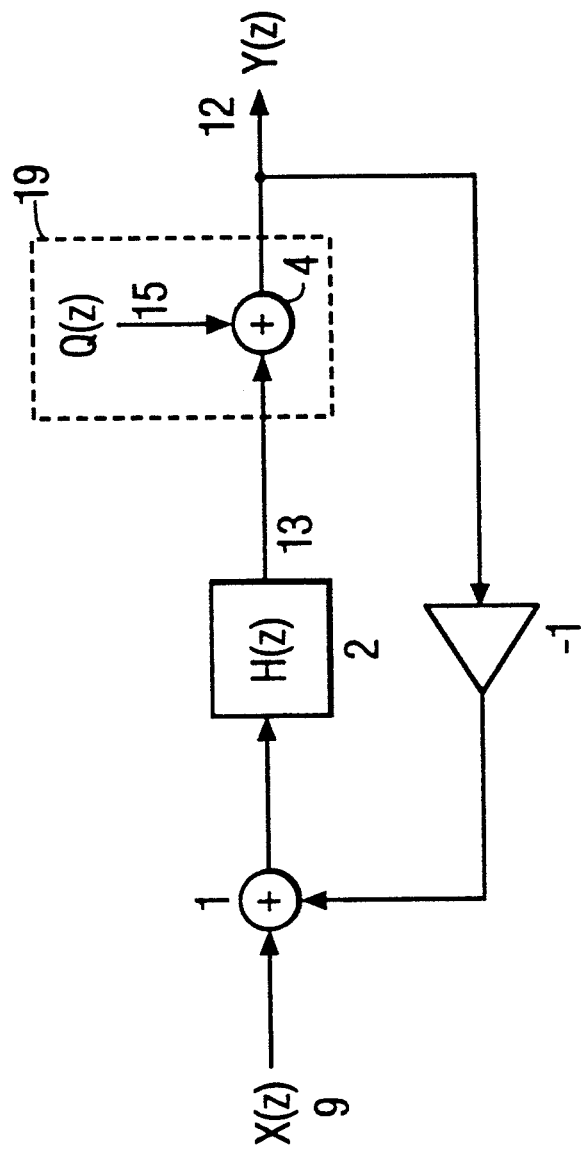
FIG. 3 shows a simplified block diagram of the circuit according to FIG. 1 omitting the convergence accelerating signals.

X(z) is the z-transform (Ref. 8, p. 16) of the input signal 9, Y(z) is the z-transform of the sub-measurement result 12 and H(z) is the z-transfer function (Ref. 8, p. 290) of the charge storage or charge summation circuit 2. FIG. 3 shows a simplified block diagram of the circuit according to FIG. 1. Here Q(z) is the z-transform of the basic quantization error 15 involved in every analog-to-digital conversion and introduced into the circuit in FIG. 3 in a virtual quantizer 19 with a summation circuit 4. In other words, in FIG. 3 the quantizer 19 substitutes for the quantization error which in reality results from the joint operation of the comparator circuit 3, the comparator output signal 16, the logic circuit 5 and the clock oscillator 6 in FIG. 1, as described above.

As is evident from FIG. 3, the basic circuit of the analog-to-digital converter is comparable to a digital Infinite Impulse Response (IIR) filter with rounding and quantization noise of the same order of magnitude as the quantization error of the analog-to-digital conversion. In this analogy, an analog input signal corresponding to a digital input signal with an infinite number of significant digits is subjected to an IIR filter process with finite number of digits with corresponding rounding and quantization noise. Consequently this quantization noise is essentially white (cf. Vaidyanathan article in Ref. 8, pp. 359–475) and can be frequency shaped by a corresponding negative feedback loop and the resulting quantization noise transfer function $H_q(z)$.

Without sacrificing generalized validity, it is assumed in the following text that the gain of the comparator and the mean reference signal value is $-1$, as shown in the block diagram of FIG. 3. With this assumption, we have the following expression for Y(z)

$$Y(z) = \frac{H(z)}{1 + H(z)} \cdot X(z) + \frac{1}{1 + H(z)} \cdot Q(z), \tag{1}$$

which, introducing the notation $$Y(z) = H_x(z) \cdot X(z) + H_q(z) \cdot Q(z) \tag{2}$$

gives for the signal transfer function $H_x(z)$ $$H_x(z) = \frac{H(z)}{1 + H(z)} \tag{3}$$

and for the quantization noise transfer function $H_q(z)$ $$H_q(z) = \frac{1}{1 + H(z)} \tag{4}$$

The representation of the transfer function of the quantization noise according to equation (4) shows how a low pass filter frequency characteristic for H(z) produces a high pass filter frequency characteristic for $H_q(z)$. Through $H_q(z)$, the essentially white quantization error 15 Q(z) is then shaped such that a high pass filter quantization noise spectrum is produced at the loop output. The total quantization noise power is $$PT = \int_{-\pi}^{\pi} |H_q(\Omega)|^2 \, d\Omega, \tag{5}$$

where $\Omega$: $z=e^{j\Omega}$, $j=\sqrt{(-1)}$, and $H_q(\Omega)$ results from $H_q(z)$ by substituting $e^{j\Omega}$ for z.

Because of the noise shaping by $H_q(z)$, this power can be reduced very considerably by the subsequent digital filtering with the transfer function $F(\Omega)$ and cut-off frequency $\Omega_g$. Therewith the effective noise power becomes $$PF = \int_{-\pi}^{\pi} |H_q(\Omega)|^2 \cdot |F(\Omega)|^2 \, d\Omega. \tag{6}$$

Transposing equation (4), we get the following relationship for deriving H(z) from $H_q(z)$:

$$H(z) = \frac{1 - H_q(z)}{H_q(z)} \tag{7}$$

The choice of noise shaping transfer functions is restricted by the requirement that the loop shall not have any delay-free path. It follows therefrom that the order of the numerator polynomial of H(z) is one less than the order of the denominator polynomial of H(z). Considering a quantization error 15 introduced at the virtual summation circuit 4, it can be influenced at the earliest after a delay of $z^{-1}$ via the loop in FIG. 3, i.e. this virtual quantization error 15 appears in the sub-measurement result 12 initially unchanged with a weight factor of 1. This means that the first pulse response of the noise transfer function $H_q(z)$ must be equal to 1. Only such $H_q(z)$ can be used for our design.

Some preferred implementation examples and design rules are described in the following text.

The function $$H_q(z) = (1-z^{-1})^N \tag{8}$$

with $N \geq 1$ constitutes an Nth order differentiation. It fulfills the requirement that the first pulse response shall be 1. From equation (8) we get the following frequency characteristic $$H_q(\Omega) = (2 - \sin(\Omega/2))^N. \tag{9}$$

The quantization noise transfer function according to equation (8) is an optimum noise transfer function because it is independent of the statistics of the input signal and of the quantization error. For H(z), it follows therefrom from equation (7) that $$H(z) = \frac{1}{(1-z^{-1})^N} - 1. \tag{10}$$

Figure 4A:
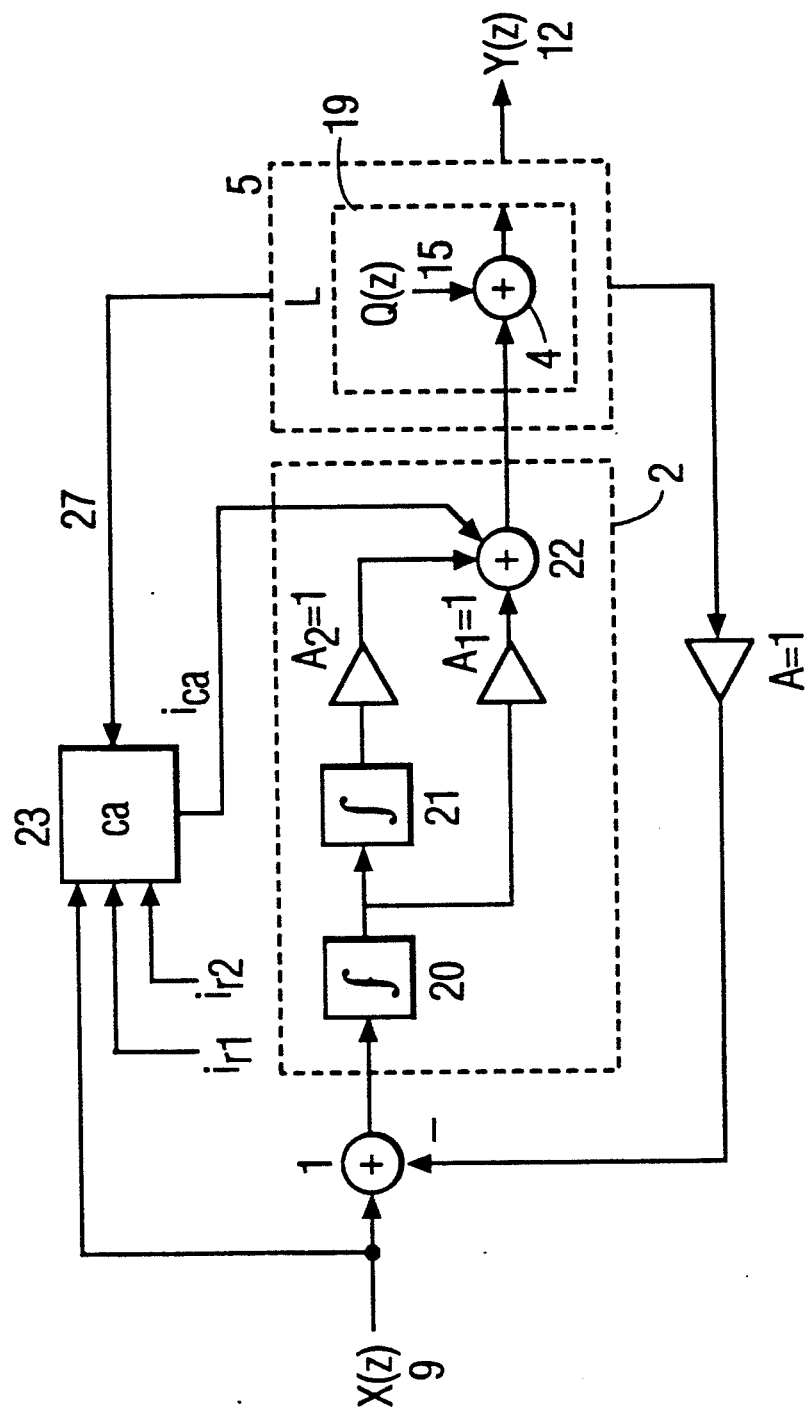
FIG. 4a shows the block diagram of a second order analog-to-digital converter with single downward integration.
Figure 5A:
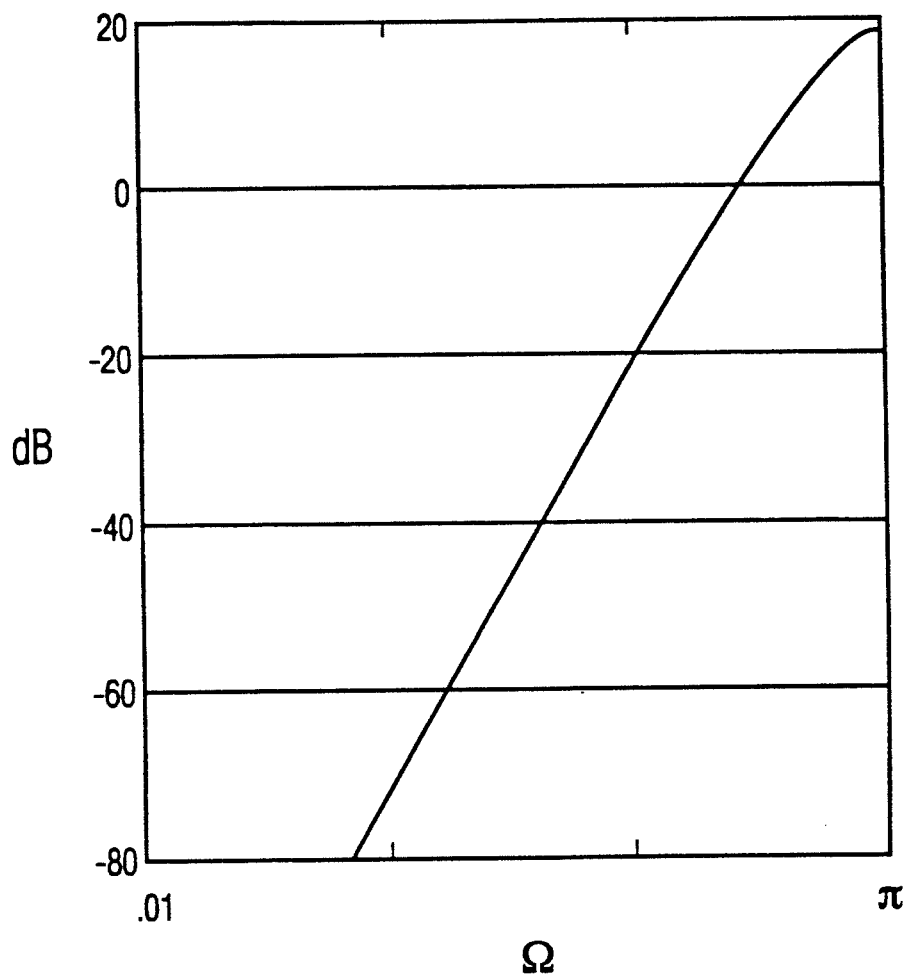
FIG. 5a, FIG. 5b and FIG. 5c show typical high pass frequency characteristics obtained through 3rd order noise shaping for $H_q(z)$ with pure differentiation (FIG. 5a), after linearization of the passband (FIG. 5b) and after optimization with further zero points (FIG. 5c)

Circuits with high pass filter frequency characteristics can be implemented by 2nd order noise shaping with pure differentiation for $H_q(z)$, similar to what is shown in FIG. 5a for the 3rd order, as in the preferred implementation form of FIG. 4a. Here the charge storage or charge summation circuit 2 consists of the integrators 20 and 21 and the sum or difference circuit 22. Taking $$I(z) = (1-z^{-1})^{-1} \tag{11}$$

as the transfer function of the individual integrator and $z^{-1}$ as the transfer function of the quantizer 19, we obtain for H(z):

$$H(z) = \left( \frac{1}{1-z^{-1}} + \frac{1}{(1-z^{-1})^2} \right) \cdot z^{-1} \tag{12}$$

The expected Nth order differentiation for $H_q(z)$ follows therefrom with the aid of equation (4):

$$H_q(z) = (1-z^{-1})^2. \tag{13}$$

As already indicated in FIG. 2b, in this solution the integrators 20 and 21 can be implemented in various ways, e.g. inverting and non-inverting. If necessary, an inversion can be cancelled again by a second inversion in the next integrator 21 and/or in the next sum or difference circuit 22.

Without convergence accelerating signals, this procedure converges for input signals $i_e$ up to about $i_e = \frac{1}{3}$ for the critical case of k=0, whereby $i_e$ is measured here and in the following cases relative to the first reference signal $i_{r1}$ and k: $k = -i_{r2}/i_{r1}$ with $i_{r2}$ being the second reference signal. Applying convergence accelerating signals $i_{ca}$, as described in U.S. Pat. No. 5,066,955, to the point specified in FIG. 4a and/or to the sum or difference circuits 1 and/or 22, gives full convergence up to $i_e < 1$, provided that the convergence accelerating signals $i_{ca}$ fulfil the condition (20) specified below.

Figure 4B:
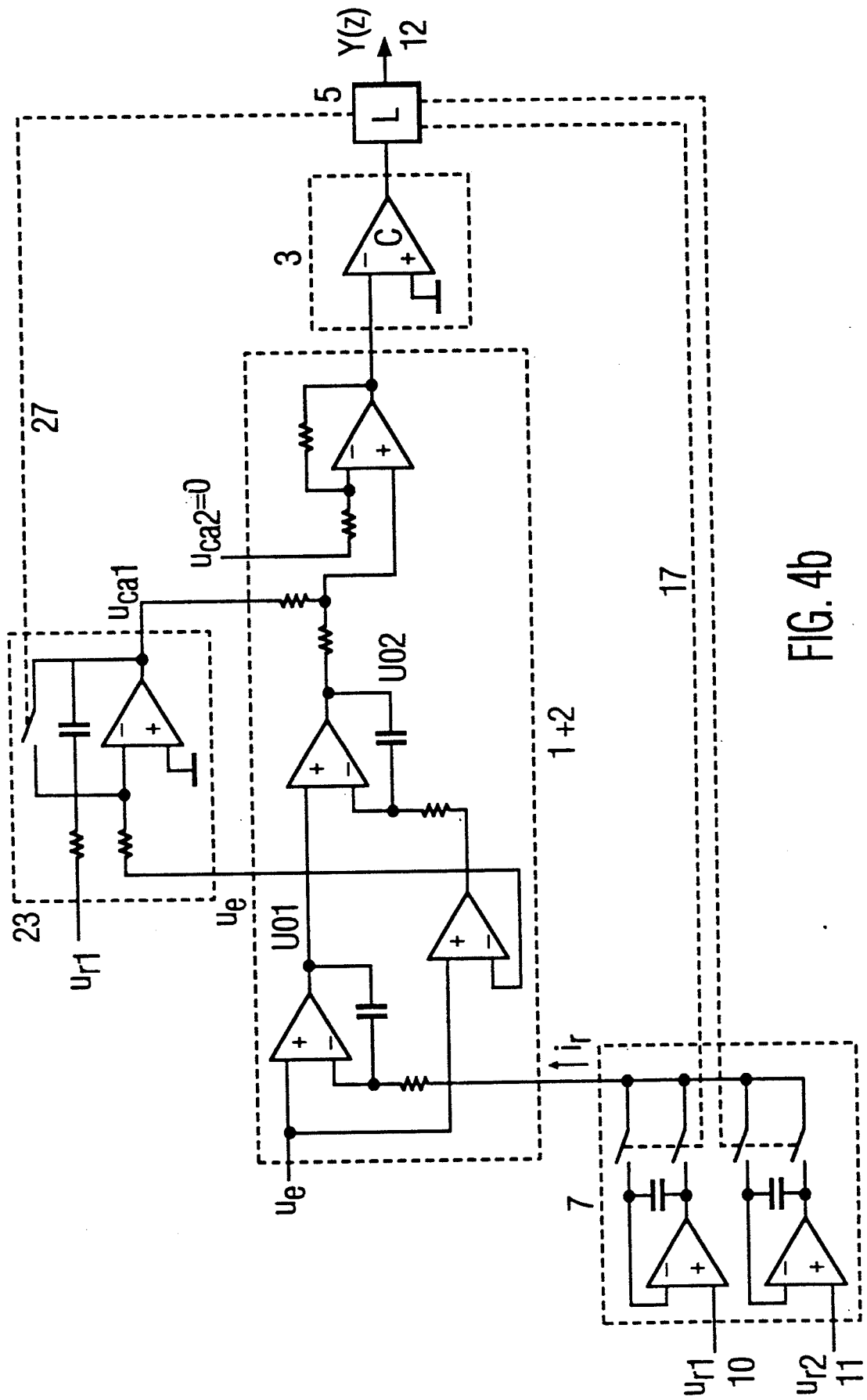
Figure 4C:
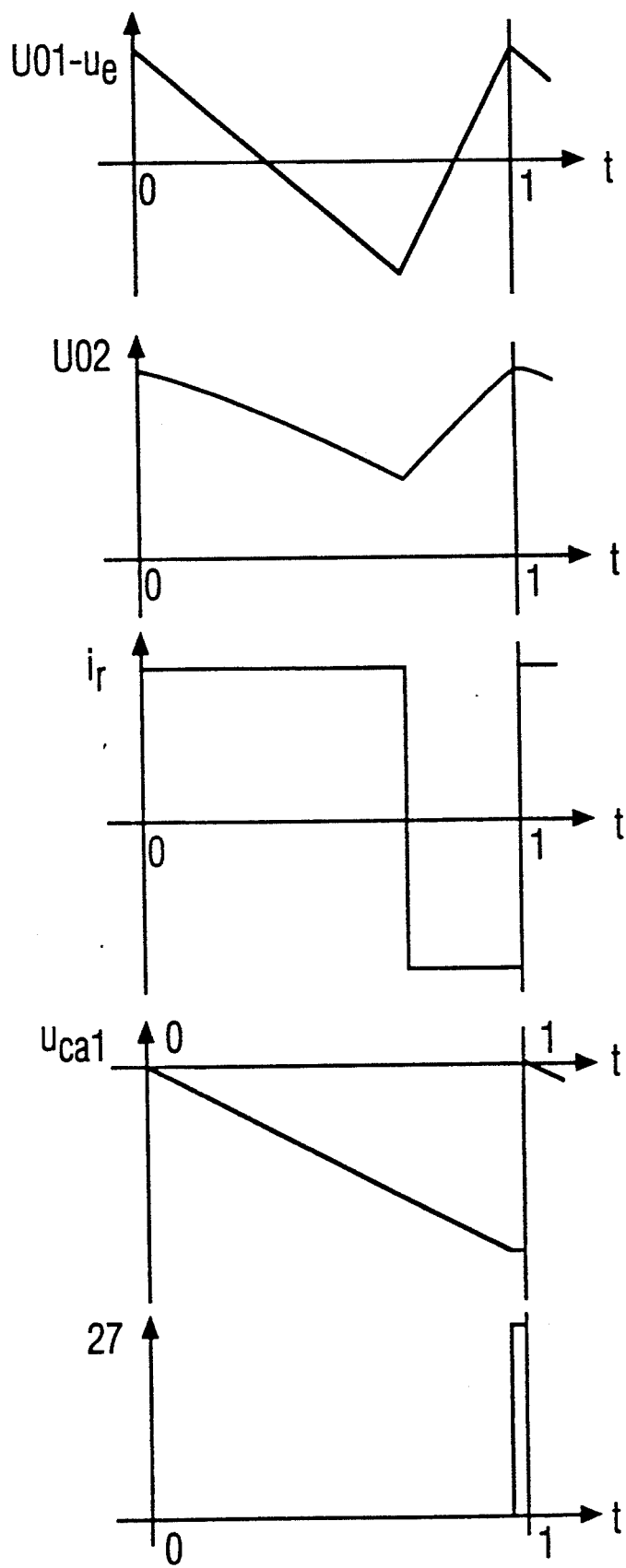
FIG. 4c shows the signal/time diagrams for FIG. 4b for ue=0.4·ur1, ur1=1 and ur2=-1.

As the circuit diagram in FIG. 4b shows, the block diagram of FIG. 4a can be implemented not only with conventional inverting integrators requiring inverters and addition circuits, but also using simple non-inverting integrators with proportional component, whereby the proportional components can be used to obtain the effect of $A_1$ and partially for producing the convergence accelerating signals $i_{ca}$ (for clarity these variables are represented in FIG. 4b and FIG. 4c, where voltages are involved, by an indexed "u" instead of the general indexed variables "i" understood in this document to stand for signals). Choosing the integrator time constants to be equal to the time taken to make one sub-measurement makes $A_1 = A_2 = 1$. This preferred implementation example also has the advantage of high impedance inputs for the input signal, the first reference signal $i_{r1}$ (or $u_{r1}$) 10 and the second reference signal $i_{r2}$ (or $u_{r2}$) 11 as well as not requiring precision resistors. Furthermore, the second reference signal $i_{r2}$ 11 can be obtained from the first reference signal $i_{r1}$ 10 (or conversely) with the aid of a charge pump circuit without any need to use precision electronic components. The convergence accelerating signal consists of a combination of $i_{ca1}$ and $i_{ca2} \cdot i_{ca1}$ is here equal or proportional to the integral over the sum of the input signal and second reference signal $i_{r2}$ (alternatively $u_{r2}$ or $-u_{r1}$) 11. $i_{ca2}$ (or $u_{ca2}$) consists of the superimposition of $i_{ca1}$ and U02. These convergence accelerating signals ensure convergence over the full range $u_{r2} < u_e < u_{r1}$ over wide ranges of the specified proportionality (approx. 0.5 to 1.5). FIG. 4c shows the signal/time diagrams belonging to FIG. 4b for a fixed input signal $i_e$ or $u_e = 0.4 \cdot u_{r1}$, $i_{r1}$ or $u_{r1} = 1$ and $i_{r2}$ or $u_{r2} = -u_{r1} - 1$, i.e. k=1. The case of k=0 is obtained for $i_{r2}$ or $u_{r2} = 0$.

However, for orders $N \geq 3$ it is necessary to take into account the nonlinearity of the comparator gain as described below and therewith the nonlinearity of the quantizer 19, as a function of the input signal 9. Defining $\sigma(0 < \sigma S \leq 1)$, the gain of the comparator circuit 3 and thus of the quantizer 19, as the ratio of the time averaged comparator output signal 16 to the time-averaged output voltage of the charge storage or charge summation circuit 13, it is seen that this gain depends on the input signal 9. The introduction of $\sigma$ changes equation (3) for the signal transfer function $H_x(z)$ to $$H_x(z) = \frac{H(z)}{1 + \sigma \cdot H(z)} \quad (14)$$

and equation (4) for the quantization noise transfer function $H_q(z)$ to $$H_q(z) = \frac{1}{1 + \sigma \cdot H(z)}. \quad (15)$$

The poles are here a function of the comparator gain $\sigma$. This has the particular consequence that, for systems as from third order ($N \geq 3$), the poles come to lie outside the unit circle in response to disturbances or changes of the input signal 9. This leads to oscillations which do not cease after removal of their cause.

The dependency of the stability on the gain of the quantizer 19 can be reduced by straightening the frequency characteristic of $H_q(z)$. This can be achieved by providing $H_q(z)$ with a denominator polynomial in addition to the N-fold differentiation. This gives the general form of an Nth order high pass filter:

$$H_q(z) = \frac{(1 - z^{-1})^N}{1 + b_1 \cdot z^{-1} + \ldots + b_N \cdot z^{-N}}. \quad (16)$$

An iterative procedure for determining the parameters in equation (16) can be formulated as follows:

1) Determination of the desired order of the system.
2) Design of an Nth order high pass filter, e.g. a Butterworth (cf. Ref. 8, p. 306 ff.) filter according to Ref. 6), by bilinear transformation. An initial value is defined for the cut-off frequency, e.g. between 0.02 and 0.1 of the sampling frequency. This produces a transfer function G(z) whose gain is unity above its cut-off frequency:

$$G(z) = \frac{K \cdot (1 - z^{-1})^N}{1 + b_1 \cdot z^{-1} + \ldots + b_N \cdot z^{-N}}. \quad (17)$$

Due to the requirement that the first pulse response must be unity, this gives for $H_q(z)$ $$H_q(z) = \frac{1}{K} \cdot G(z). \quad (18)$$

3) Determination of the gain $V = 1/K$ for $H_q(z)$ at higher frequencies.
4) If the gain does not lie in the range 0 ... 6 dB, the cut-off frequency must be changed. Reduction of the cut-off frequency reduces the gain and conversely. Then continue back at 3).
5) Check whether, with this filter configuration, together with the planned digital filter, the desired suppression of the quantization noise is achieved with the envisaged oversampling. If this is not the case, either the magnitude of the oversampling or the filter parameters or the magnitude of the orders must be changed.

$H_q(z)$ can be optimized by adding zero points:

$$H_q(z) = \frac{(1 - z^{-1})^N (1 + a_1 z^{-1} + \ldots)}{1 + b_1 z^{-1} + \ldots + b_N z^{-N}}. \quad (19)$$

The transition range of the high pass filter can be steepened by this means, so that less noise power falls into the stop band (cf. Ref. 8, p. 60) where the input signal 9 lies and thus optimum noise suppression can be achieved with the digital filtering described later. Since the coefficients which determine the zero points have only a slight effect on the cut-off frequency of $H_q(z)$, they can be determined subsequently. Particular possibilities would be, for example, a high pass filter design according to Tschebyscheff (cf. Ref. 8, p. 306 ff.) with ripple in the stop band or according to Cauer (cf. Ref. 6, p. 384 ff.) with ripple in the stop band and in the pass band, in order to obtain the desired zero points in the stop band. The zero points were initially inserted empirically by hand in equation (19). The design according to Tschebyscheff or according to Cauer leads to automatic generation of the zero points depending on the required bandwidth, slope and residual ripple. The dimensioning equation then gives the filter order. When $H_q(z)$ has been determined, H(z) can be calculated with the aid of equation (7).

Setting up the z-transform functions in all the equations given above involves, among other requirements, the provision of z-transform functions for the charge storage or charge summation circuit 2 and for the individual circuit modules contained therein. In the multiple ramp procedure this is possible exactly only for $i_e \rightarrow 0$. Otherwise the conventional assumption for an integrator $$I(z) = (1 - z^{-1})^{-1} \quad (11)$$

is valid only approximately. This is so because, although the multiple ramp procedure operates discretely in time due to the fixed time raster of the sub-measurement starting times, in the case of disturbances in the absence of convergence accelerating signals, a fixed time raster for measuring the input signal $i_e$ is obtained not for an individual sub-measurement, but only on the average for measuring the input signal i. This fact, together with the dependence of the gain of the comparator circuit 3 on the input signal, leads to instability of the converter circuit above a certain limiting value of the input signal $i_e$, which lies at 0.5 for converter order N=1, at approx. ⅓ for the implementation example of FIG. 4a, omitting the source for convergence accelerating signals $i_{ca}$ 23 with N=2, and with corresponding design also somewhere in the range ¼ ... ½ for the implementation examples with parameters $A_i$ not equal to 1 and $B_i$ not equal to 0, as is typically the case for N>2.

Figure 6:
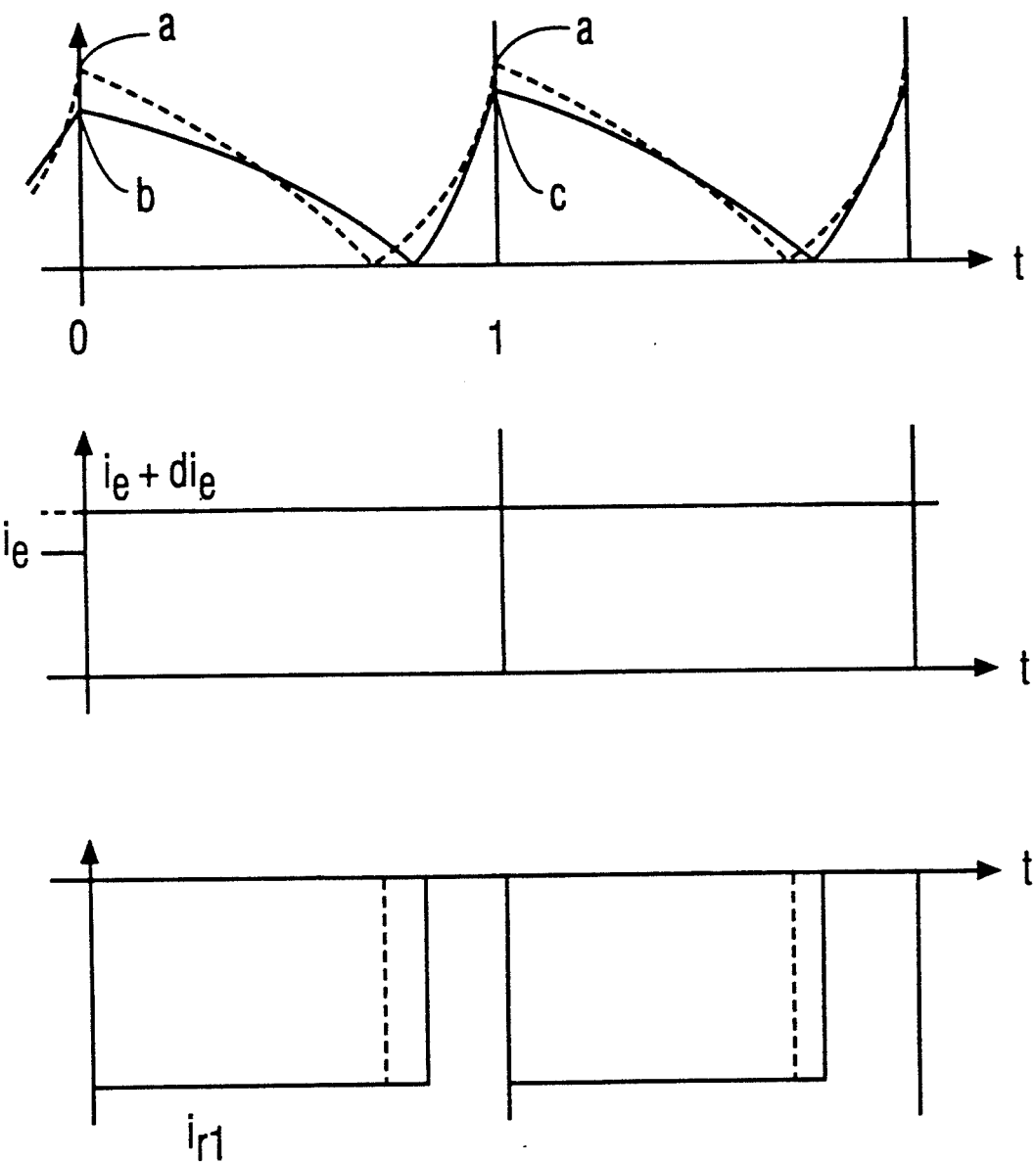
FIG. 6 is a depiction and explanation of the convergence condition.

The voltages $U0_n(i_e, U01_{n-1}, U02_{n-1}, \ldots)$, n=1, 2, ..., $\infty$, present at the output of the charge storage or charge summation circuit 2 at the start of the n-th sub-measurement, due to application of the input signal $i_e$, the reference signals $i_{r1}$, $i_{r2}$ and the convergence accelerating signals $i_{caj}$, are a function of the input signal and of the output signals $U01_{n-1}$, $U02_{n-1}$, ... of the individual integrating stages 20 according to FIG. 2a at the beginning of the (n−1)th submeasurement. From the behaviour of $U0_n(i_e, U01_{n-1}, U02_{n-1}, \ldots)$ on change of $i_e$ according to FIG. 6 from a settled state $i_e$ at the start of a sub-measurement with output signal $U0_{n-1}(i_e, U01_{n-1}, U02_{n-1}, \ldots)$, see item b in FIG. 6, to $i_e + $ $di_e$ with output signal $U0_n(i_e+di_e, U01_{n-1}, U02_{n-1}, \ldots)$, see item c in FIG. 6, the following sufficient condition can be formulated for producing the convergence accelerating signals:

$$\left| \frac{\delta U0_n(i_e, U01_{n-1}, \ldots)}{\delta i_e} - \frac{dU0_\infty(i_e)}{di_e} \right| < \left| \frac{dU0_\infty(i_e)}{di_e} \right| \quad (20)$$

Here the symbol $\delta$ stands for partial differentiation. As indicated in FIG. 2a, $U0_n(i_e, U01_{n-1}, U02_{n-1}, \ldots)$ is the resulting output signal of the charge storage or charge summation circuit 2 including the effects of the one or more convergence accelerating signal(s) $i_{caj}$. The corresponding output signal in the settled state with constant $i_e$ is $U0_{2s}(i_e)$, see item a in FIG. 6 for $U0_{2s}(i_e+di_e)$.

So this means that applying convergence accelerating signals $i_{caj}$ of the kind described above and in Ref. 4) and Ref. 2), to the points specified in FIG. 2a, gives full convergence up to $i_e < 1$ when the convergence accelerating signals are chosen such that the $U0_n(i_e, U01_{n-1}, U02_{n-1}, \ldots)$ also affected by them fulfill the condition 20.

As an example, a converter is implemented with an analog filter of third order according to Butterworth for $H_q(z)$. The normalized transfer function after low pass to high pass transformation is:

$$G(p) = \frac{K_1 \cdot p}{(1 + a_1 \cdot p)} \cdot \frac{K_2 \cdot p^2}{(1 + a_2 \cdot p + b_2 \cdot p^2)}, \quad (21)$$

where $p = j \cdot \Omega$ and $\Omega$ is the radian frequency normalized with respect to the cut-off frequency $\Omega_g$, and the coefficients $K_v$, $a_v$ and $b_v$ are calculated according to Ref. 6). Applying the bilinear transformation $$p = \frac{2}{T} \cdot \frac{z-1}{z+1} \quad (22)$$

produces the formula $$G(z) = \frac{K \cdot (z-1)^3}{z^3 + C_2 \cdot z^2 + C_1 \cdot z + C_0} \quad (23)$$

Because the first pulse response must be unity, this becomes, as has already been shown, $$H_q(z) = \frac{1}{K} \cdot G(z). \quad (18)$$

As already described above for the iterative procedure under 4), this gain is adjusted to a value of approx. 6 dB with the aid of the cut-off frequency $\Omega_g$.

Empirical procedure can be used to calculate the zero points. For this purpose, the numerator is factorized and the parameter $D_1$ is introduced:

$$H_q(z) = \frac{(z-1) \cdot ((z-1)^2 + D_1)}{z^3 + C_2 \cdot z^2 + C_1 \cdot z + C_0}. \quad (24)$$

Thereby $C_0 \ldots C_2$ determine the poles of $H_q(z)$ and $D_1$ produces a double zero point for optimising $H_q(z)$. The starting value for $D_1$ lies at 0.001 to 0.01. With the aid of, for example, a commercial mathematics software package, such as "MathCAD" from MathSoft, Inc., which permits graphical depiction of the frequency characteristic belonging to $H_q(z)$, $D_1$ is dimensioned such that optimum suppression of quantization noise is obtained in the frequency spectrum of the input signal which is to be digitized. This leads here to the following results:

| | | |
|---|---|---|
| $\Omega_g = 0.2 \cdot \pi$ | $20 \cdot \lg(1/K) = 5.6$ dB | |
| $C_2 = -1.76$ | $C_1 = 1.183$ | $C_0 = -0.278$ |
| $D_1 = 0.004$ | | |

Figure 5B:
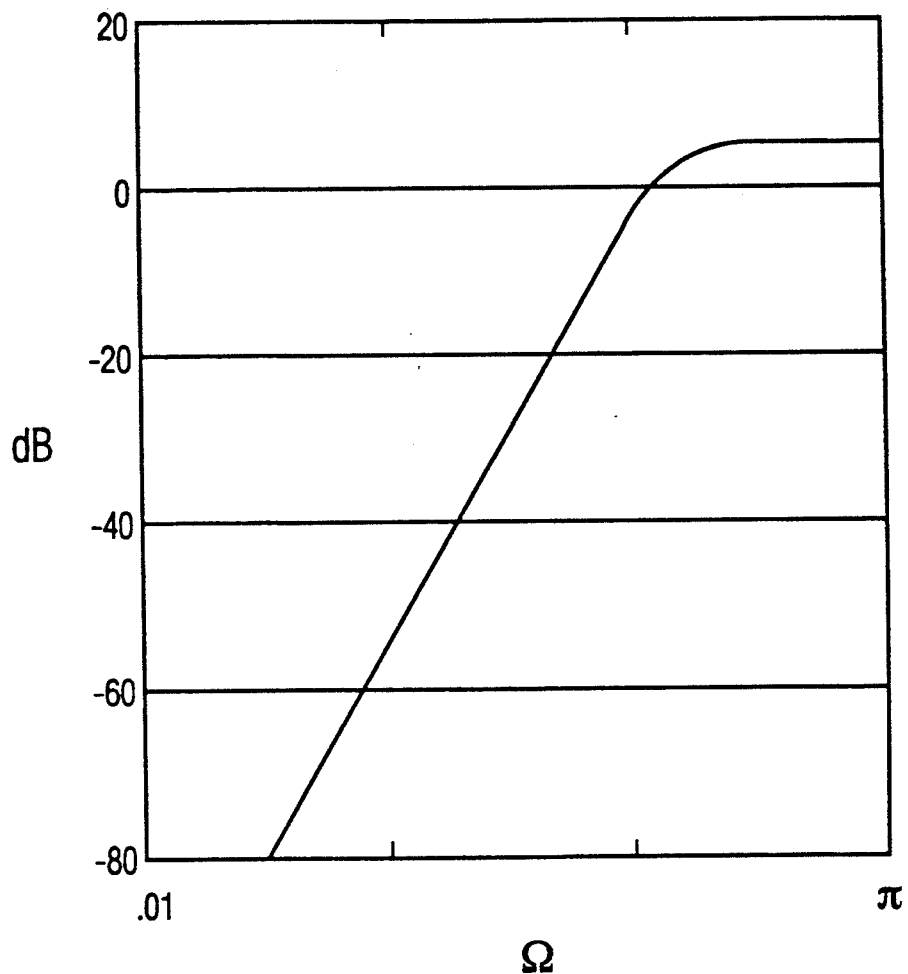
Figure 5C:
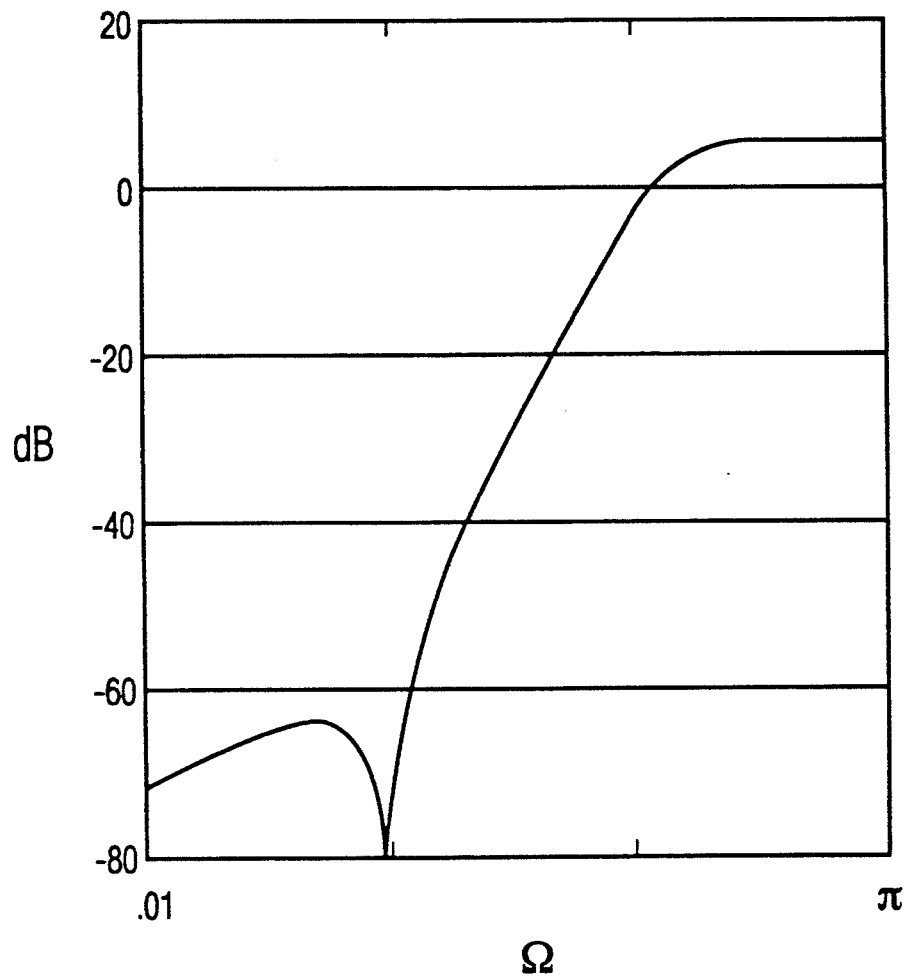

FIG. 5a, FIG. 5b and FIG. 5c show the high pass filter frequency characteristics belonging to these calculated parameters by third order noise shaping for $H_q(\Omega)$ with pure differentiation (FIG. 5a), after straightening the passband (FIG. 5b) and after optimization with further zero points (FIG. 5c).

With the aid of the relationship (7), the expression for $H(z)$ with the now-known parameters $C_0$, $C_1$, $C_2$ and $D_1$ becomes:

$$H(z) = \frac{(C_2+3) \cdot z^2 + (C_1-D_1-3) \cdot z + (C_0+D_1+1)}{z^3 - 3 \cdot z^2 + (3+D_1) \cdot z + (-D_1-1)}. \quad (25)$$

Figure 7A:
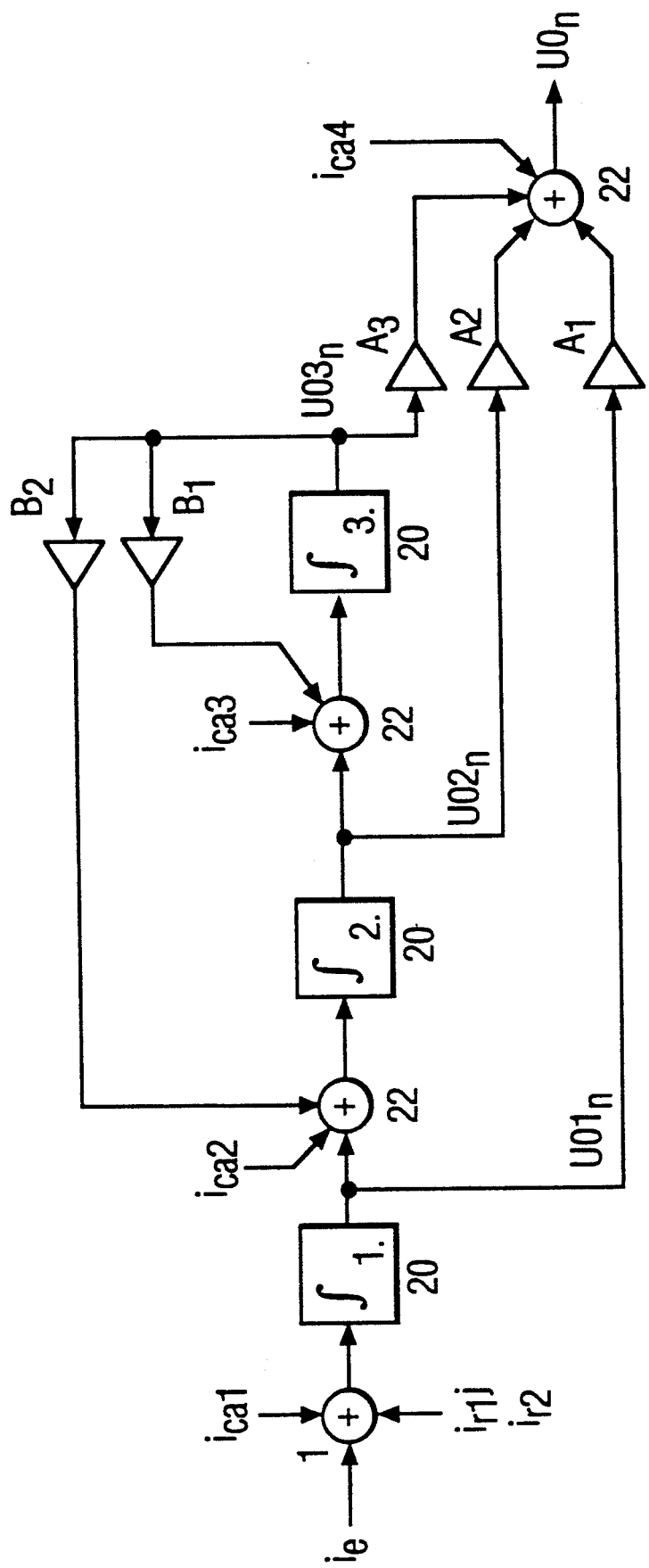
FIG. 7a shows the implementation of a third order charge storage or charge summation circuit with Butterworth characteristic and zero point optimization.

This transfer function is now implemented for N=3 in a circuit according to FIG. 7a. The transfer function for FIG. 7a is initially $$H(z) = \left[ A_1 \cdot I(z) + \frac{A_2 \cdot I^2(z) + A_3 \cdot I^3(z)}{1 - B_1 \cdot I(z) - B_2 \cdot I^2(z)} \right] \cdot Q(z) \quad (26)$$

where $I(z)$ and $Q(z)$ are the z-transforms of the integrators and of the quantizer. With the assumptions (11) and $$Q(z) = z^{-1} \quad (27)$$

the following numerical values are obtained for the coefficients $A_i$ and $B_i$ by comparison of coefficients in the equations (25) and (26) which must first of all be expanded by multiplying out:

| | | |
|---|---|---|
| $A_1 = 0.722$ | $A_2 = 0.373$ | $A_3 = 0.145$ |
| $B_1 = 0.00797$ | $B_2 = -0.00398$ | |

Figure 7B:
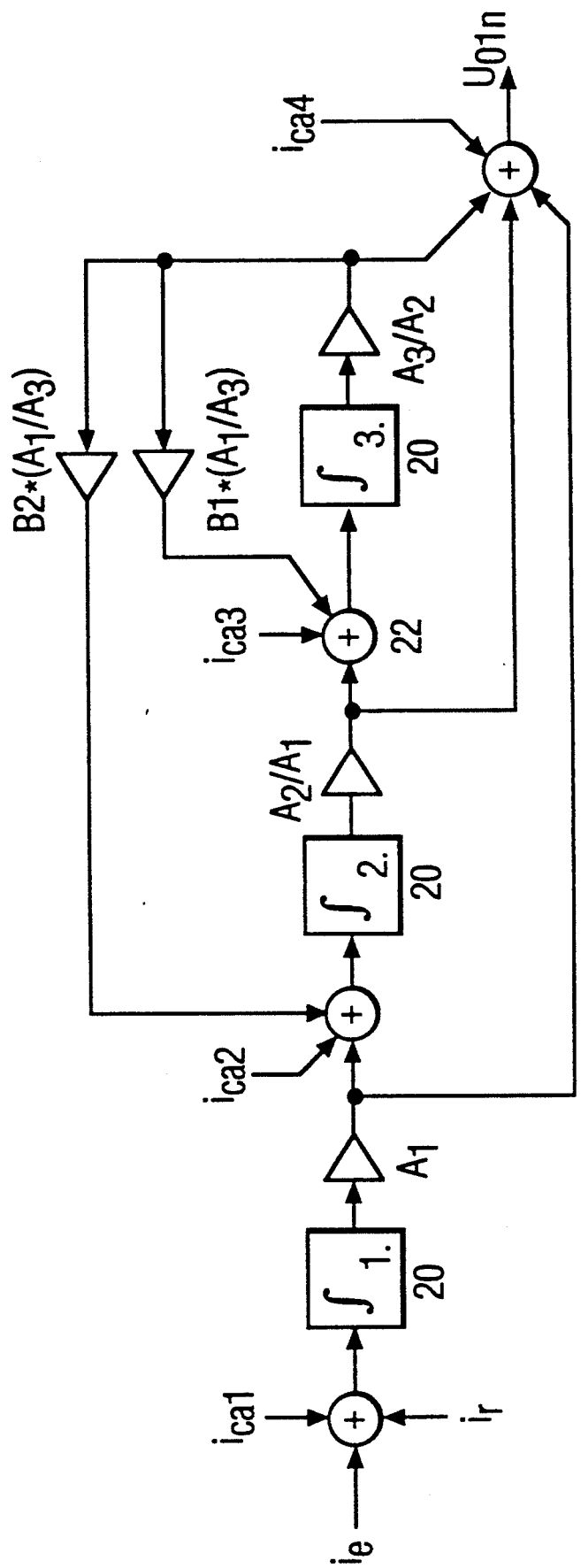
FIG. 7b shows the implementation of the coefficients according to FIG. 7a by adjusting the integrator gain.
Figure 8:
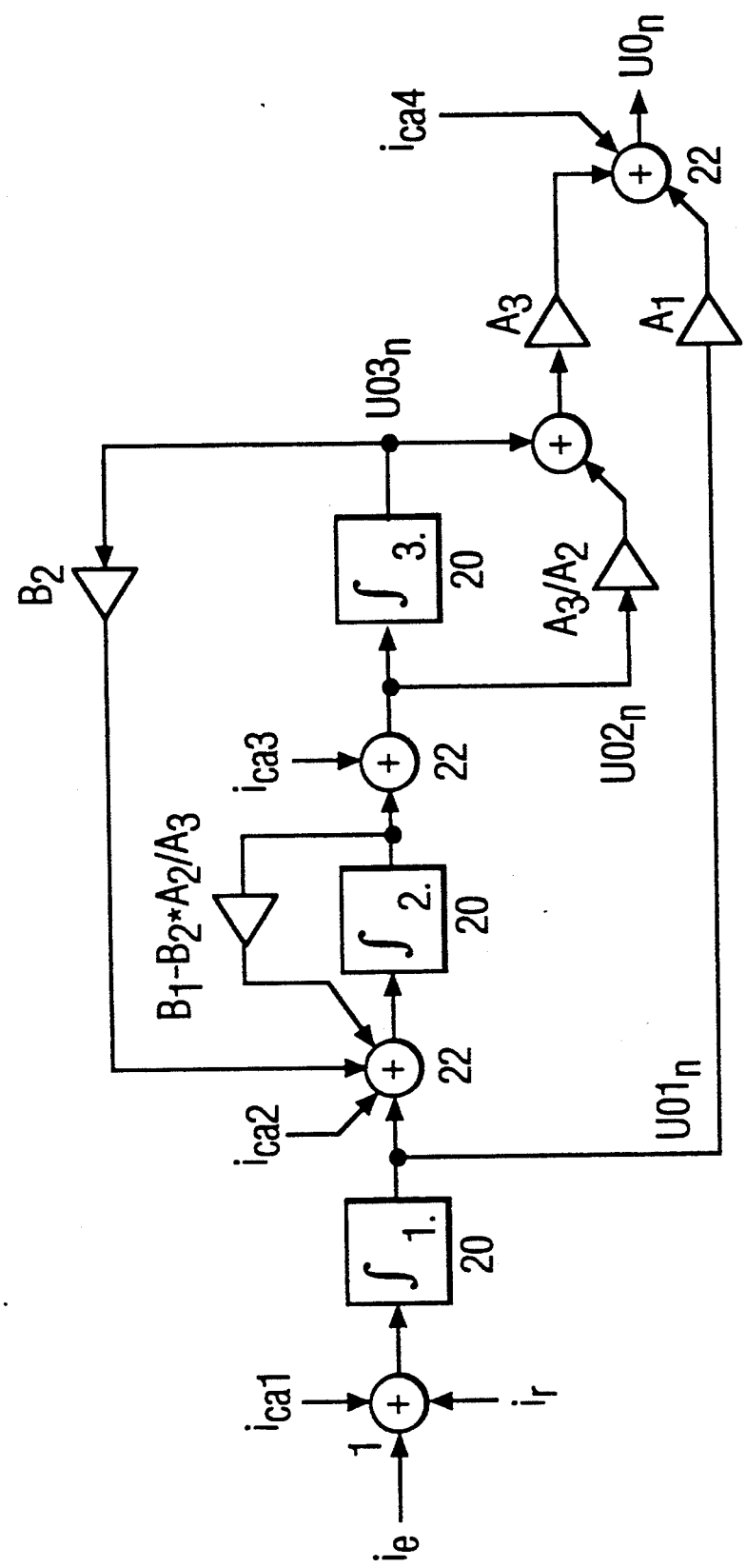

The parameters $C_0$, $C_1$, $C_2$ and $D_1$, calculated according to equation (24) for $H_q(z)$, which ultimately determine the shaping of the quantization noise, can be implemented not only in the manner shown in FIG. 7a with the special $A_i$ and $B_i$ for this practical configuration, but also in an almost unlimited number of other ways. This is true in particular through combination and substitution of the forward and backward couplings represented by the $A_i$ and $B_i$ for all possible injection points of this system as familiar from the design and construction of digital filters (e.g. Ref. 8, chapters 2 to 4). Other possible implementations are shown for example in FIG. 2a, again with special $A_i$ and $B_i$ for this configuration, and FIG. 7b in which the integrator drive can be optimized with respect to FIG. 7a by using special integrator gain factors as specified there. FIG. 8 shows a third preferred implementation form for a third order noise shaping according to FIG. 7a in which an integrator with proportional component $A_2/A_3$ is used as third integrator.

Figure 9A:
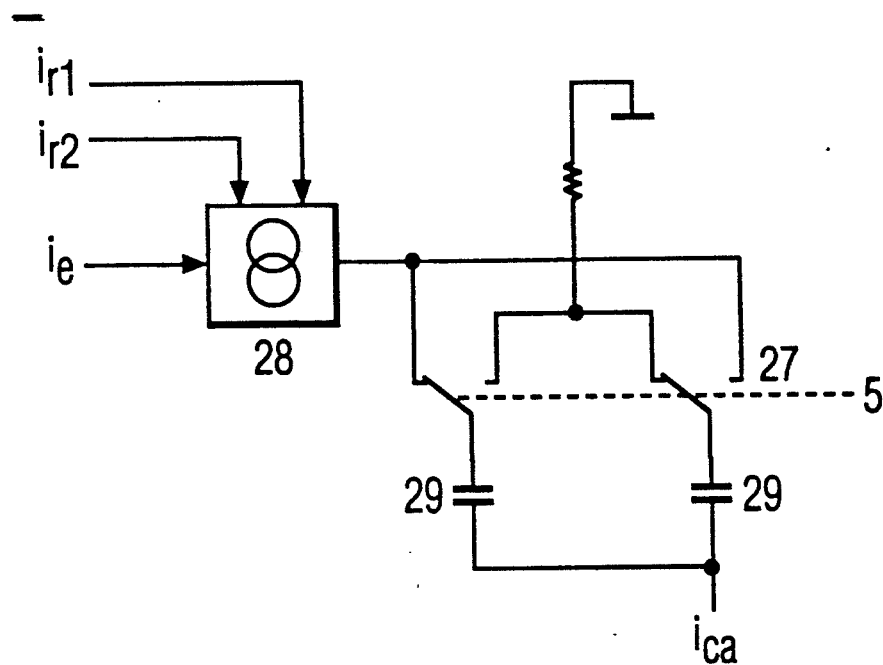
FIG. 9a and FIG. 9b show preferred embodiments of sources of convergence accelerating signals 23.

The circuit according to FIG. 7a permits injection of convergence accelerating signals individually or jointly at all summation or difference circuits 22. FIG. 9a shows a preferred implementation of a source for convergence accelerating signals 23. It can be used with particular convenience for $i_{ca3}$ in FIG. 7a using the variables $i_e$ and $i_{r2}$ as drive signal for the current source 28. The logic control signal 27 for the source of the convergence accelerating signals 23 in this case alternately switches one of the two capacitors 29 to receive the output signal of the controlled current source 28 while the other one is being discharged through the resistor in FIG. 9a. Because the coefficient $A_1$ dominates in practical implementations of the charge storage or charge summation circuit 2 as from the third order, convergence is also achieved for the charge storage or charge summation circuit 2 according to FIG. 7a when the signal of the source for convergence accelerating signals $i_{ca}$ 23 is injected according to FIG. 9a as $i_{ca1}$ or $i_{ca2}$. According to the different magnitudes of the coefficients $A_1$ to $A_3$, it is then only necessary to provide different weighting, in order to obtain a signal with approximately the same magnitude at the output of the charge storage or charge summation circuit 2.

Figure 9B:
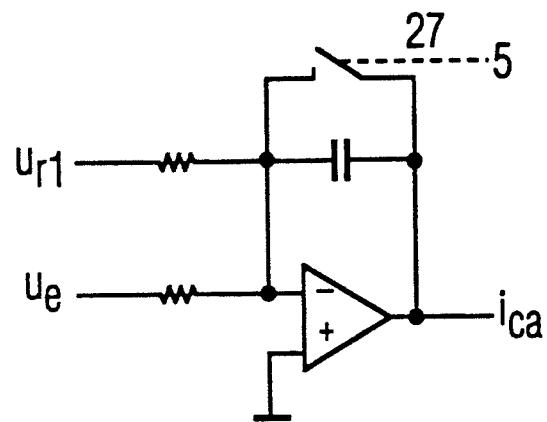

Whereas the source for convergence accelerating signals 23 just discussed requires an injection point which has a signal path via at least one integrator, so that a convergence accelerating signal appears at the output of the charge storage or charge summation circuit 2, another preferred implementation example of sources for convergence accelerating signals 23 according to FIG. 9b—such an implementation has already been used in FIG. 4b—offers the possibility of injection directly before the output as $i_{ca4}$ in FIG. 7a or as $i_{ca(N+1)}$ in FIG. 2a.

As has already been mentioned, it is appropriate in the case of oversampling converters to interpose a digital filter after the actual analog-to-digital converter in order to obtain good suppression of noise outside the signal band. For this purpose the filter should be of highest possible order, at least of higher order than the noise shaping in the analog-to-digital converter. Finite Impulse Response (FIR) and IIR filters can both be used for this purpose.

Decimation takes place within the digital filter or subsequent thereto. Decimation is understood to mean a reduction of the sampling or sub-measurement frequency $f_{s1}$ to a signal processing frequency $f_{s2}$ which is smaller by a factor L. This achieves a data reduction for simplification of the filter implementation and subsequent data acquisition. This is accompanied by the useful effect that only frequency components which lie in the vicinity of $f_{s2}$ ±the wanted signal bandwidth appear in the wanted signal bandwidth by aliasing (for an explanation of aliasing cf. Ref.8, p. 6). It therefore generally suffices to provide a relatively simple analog anti-aliasing prefilter in front of the analog-to-digital converter. FIG. 10 shows a filter configuration with decimizer in which a first digital filter circuit 24 is followed by a decimizer 26 and thereafter by a second digital filter circuit 25. To prevent increase of quantization noise as a consequence of the noise shaping, the attenuation given by the frequency characteristic of the filter $F(\Omega)$ above the cut-off frequency $\Omega_g$ must be sufficiently large. For the described third order converter, a fourth order digital filter is used with a decimation factor L equal to the oversampling factor L. The specification of fourth order results from the condition that no significant higher frequency aliasing components shall impair the signal to noise ratio. This condition is adequately fulfilled with a filter which has a strictly monotonic decay of the subsidiary maxima towards higher frequencies which is steeper than the increase produced by the noise shaping stage of the converter with the transfer function $H_q(z)$. Furthermore, convenient implementation of the hardware should be possible.

A fourth order comb filter is chosen as preferred implementation form. With a FIR comb filter all coefficients are by definition equal to unity so that no multiplications are necessary. This also avoids problems with quantization effects within the filter. The only additional noise source appears as a result of truncating the superfluous bits at the output of the filter (cf. Ref. 8, p. 367 ff.).

The transfer function of the filter is $$F(z) = \frac{1}{L^4} \cdot \left[ \frac{1 - z^{-L}}{1 - z^{-1}} \right]^4 \tag{28}$$

The division by the factor $L^4$ can be implemented for simplicity by software in a subsequent signal processing device 8, with the rest of the filter implemented in hardware and/or software in a subsequent signal processing device 8. Furthermore, the filter has a decimation factor of L. Separation into integrating and differentiating components gives $$F(z) = \frac{1}{(1-z^{-1})^4} \cdot (1 - z^{-L})^4 \cdot \frac{1}{L^4} \tag{29}$$

Decimation by the factor L changes $z^{-L}$ to $z^{-1}$. Thus, as shown in FIG. 11, the desired filter function is obtained with four cascaded integrators 31, 32, 33, 34, the decimator stage 35, four digital differentiators 36, 37, 38, 39 and the above mentioned software which performs the scaling by a factor of $L^4$ in a digital signal processing device 8. In the implementation of the filter according to FIG. 11 it is necessary to make sure that a number system such as the twos complement code (cf. Ref. 8, pp. 363-366) is used which, in the case of overflow by addition in the integrators 31, 32, 33, 34, does not falsify the differences to be generated in the differentiators 36, 37, 38, 39, and that an adequate word length consisting of $b_F$ bits $$b_f ld(E_F) + F_o \cdot ld(L) \tag{30}$$

is provided, where $E_F$ is the word length in bits of the filter input signal, Fo is the filter order and ld stands for binary logaritbans.

The transfer function F(z) according to equation (28) gives the frequency characteristic $$|F(\Omega)| = \frac{1}{L^4} \cdot \left| \frac{\sin(L \cdot \Omega/2)}{\sin(\Omega/2)} \right|^4 \tag{31}$$

with $\Omega$ normalized to $2 \cdot \Omega$ times the sampling or sub measurement rate $f_{s1}$. The zero points $f_{0,n}$ of $F(\Omega)$ lie accordingly in frequency units given by $$f_{0,n} = \frac{f_{s1}}{L} \cdot n, \ n = 1, 2, 3, \ldots, \text{entier}(L/2), \quad (32)$$

and the subsidiary maxima decay approximately with $1/\Omega^{F_0}$ so that decimation with the factor L is possible without severe aliasing problems for frequencies $f << f_{s2}/2 = f_{s1}/(2 \cdot L)$.

Other types of FIR filters can be employed for further refinement of the procedure, because they offer the advantage of finite settle down time in response to step changes of the input signal, a linear phase relationship for the output signal is readily realisable and with adequately long pulse responses almost any kind of frequency transfer function can be obtained with fundamental filter stability and freedom from limiting cycles, i.e. freedom from accentuated spectral lines.

A number of different design procedures can be employed for implementing such FIR filters, for example using the window design technique, procedures with frequency sampling, design procedures with linear phase and constant residual ripple in the passband or in the stop band (optimum equiripple linear phase design), half band filter design, classical interpolation procedures such as linear interpolation and procedures according to Lagrangian, special FIR filter interpolation procedures based on characteristics of the filter in the time domain or on stochastic features of the input signal (cf. Ref. 6 and Ref. 8).

Although the number of FIR filter coefficients is rather large when implementing steep edge filters, a drastic reduction of the computation effort is possible for the systems with decimation here involved, by judicious cascading of several FIR filters as shown in the example of the 4th order comb filter. A very wide range of different filter structures can be employed here, such as direct structures, cascaded structures, parallel structures, frequency sampling structures, rapid convolution in the time domain (cf. Ref. 8, chapters 7 and 8) with the aid of the fast Fourier transform (FFT), implementation with IIR structures, transposed structures, polyphase structures and structures with timedependent coefficients.

Further preferred implementation forms of the invention employ FIR filters with which almost any kind of transfer function can be obtained, particularly for steep edge filters. No exact phase relationships are possible, but some good approximations exist.

For designing a further class of such FIR filters, classical design procedures from analog technology can be used, for example with subsequent bilinear transformation of analog filters (Butterworth, Bessel, Tschebyscheff, Cauer [elliptical filters] etc.). Still other design procedures are also available, such as the method of pulse invariance, the method of system reaction invariance, approximation in the z-domain, frequency transformation, optimum design procedures with constant residual ripple in the passband or in the stop band (optimal equiripple design) and special IIR design procedures based on transformation of classical design procedures taking the decimation into account.

A large number of different filter structures can be employed for this purpose, such as direct structures, cascaded structures, parallel structures, transposed structures, wave digital filters, polyphase structures and structures with time-dependent coefficients, Ref. 6) and Ref. 8).

Further preferred implementation forms of the invention employ combinations of IIR and FIR filters, for example the series connection of an IIR and a FIR filter where a relatively fast comb filter lies before the decimation or partly or entirely performs the decimation too, followed by a steep edge IIR filter involving considerable computation effort.

Additional noise sources arise in digital filters through the use of quantized coefficients. Truncation of the signals inside and at the output of the digital filter to give a finite word length is also an additional noise source. Thus in the other preferred implementation forms, particularly when using IIR filters, cascaded or parallel structures are given preference over direct structures, in order to mitigate these effects. Another possibility is digital shaping of the error signal spectrum produced by the quantization effects in the filter (cf. Ref. 8, pp. 359-475). Analog feedback of the quantization noise spectrum of the filter to the converter input is also possible, corresponding to the feedback of the quantization noise spectrum of the analog-to-digital converter.

When dimensioning the filters, attention must be given to preventing overflow effects through overshoot of the numerical ranges. This is achieved by careful scaling of the filter coefficients and corresponding choice of the internal processing width.

Increased convergence is achieved by applying the signal inversion or transposition theorem of Mason from the theory of linear signal flow graphs (cf. Ref. 9) to the results described above. This theorem states that the system functions of two systems are identical when the second system can be derived from the signal flow graph of the first system by exchanging input and output and reversing all signal flow directions. Applied to analog-to-digital converters this gives as transposed structure instead of converters with single downward integration as described above, converters with equivalent noise shaping and multiple down-ward integration. This is the case as in the procedures in DE 39 21 976 and U.S. Pat. No. 5,066,955 when convergence accelerating signals are applied to the inputs or to the respective preceding further summation or difference circuits 22 of the further integrators 20 following after the first integrator 20, which are proportional to the first reference signal $i_{r1}$ 10 or to the second reference signal $i_{r2}$ 11, as stated as a possibility in the cited patent specifications.

Figure 12:
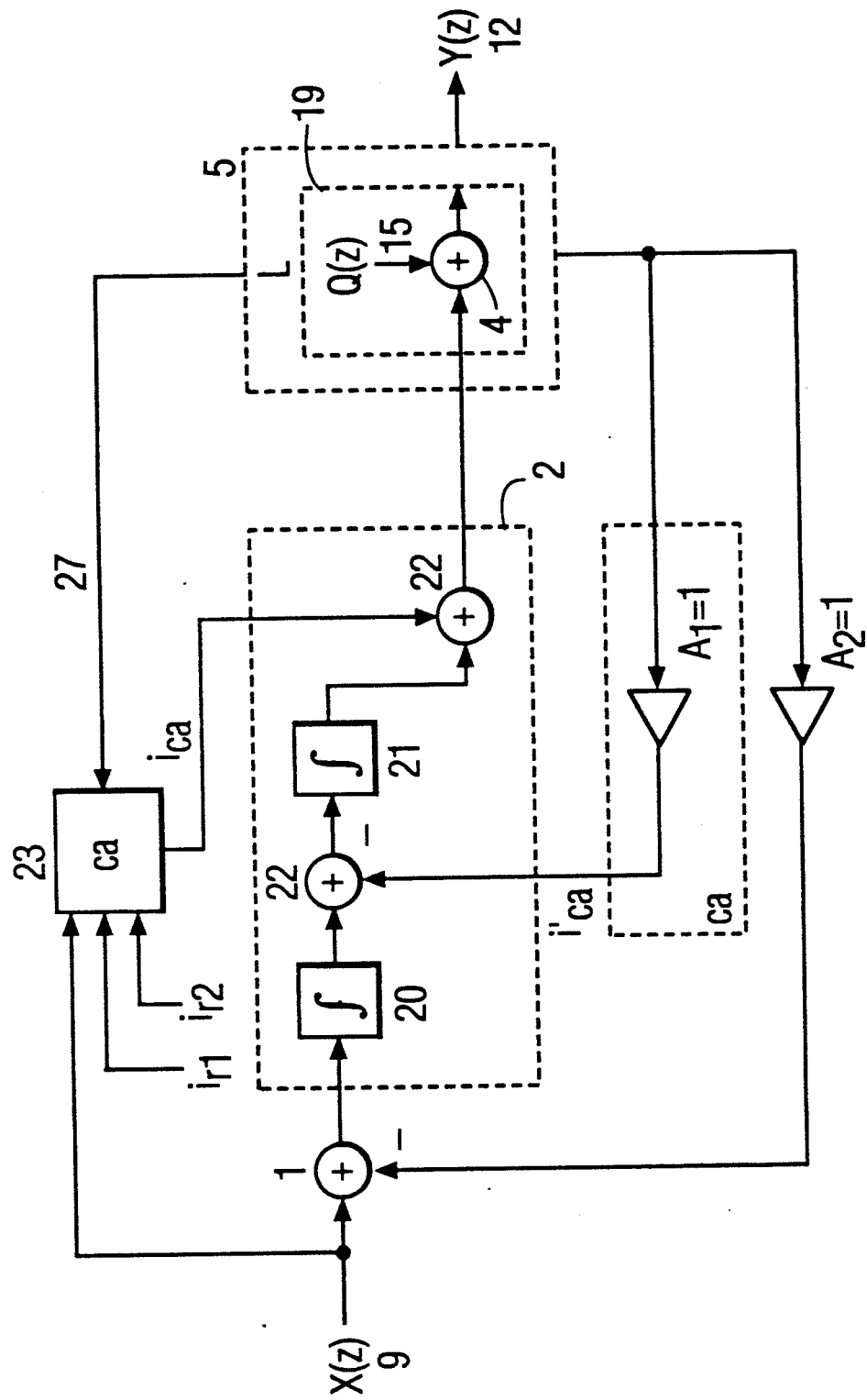
FIG. 12 shows a second order analog-to-digital converter with multiple downward integration by additional convergence accelerating signals $i'_{ca}$.

From the second order converter according to FIG. 4a, neglecting the covergence accelerating signals $i_{ca}$ present there, one first of all obtains the circuit according to FIG. 12. Here the new convergence accelerating signal $i'_{ca}$ arises, which is applied from one or several sources for convergence accelerating signals 23 of the kind defined above, in particular one proportional to the switched reference signals 10 and/or 11 with $A_1 = A_2 = 1$ coming from the switching circuit 7 (see FIG. 1 and FIG. 4b). Thereafter, to increase the convergence, the convergence accelerating signal $i_{ca}$ familiar from FIG. 4a can also be applied. The transfer function $H_q$ for the noise shaping of the quantization noise has not been changed by these and the following examples arising through transposition, or it is only slightly modified by the following example.

Figure 13:
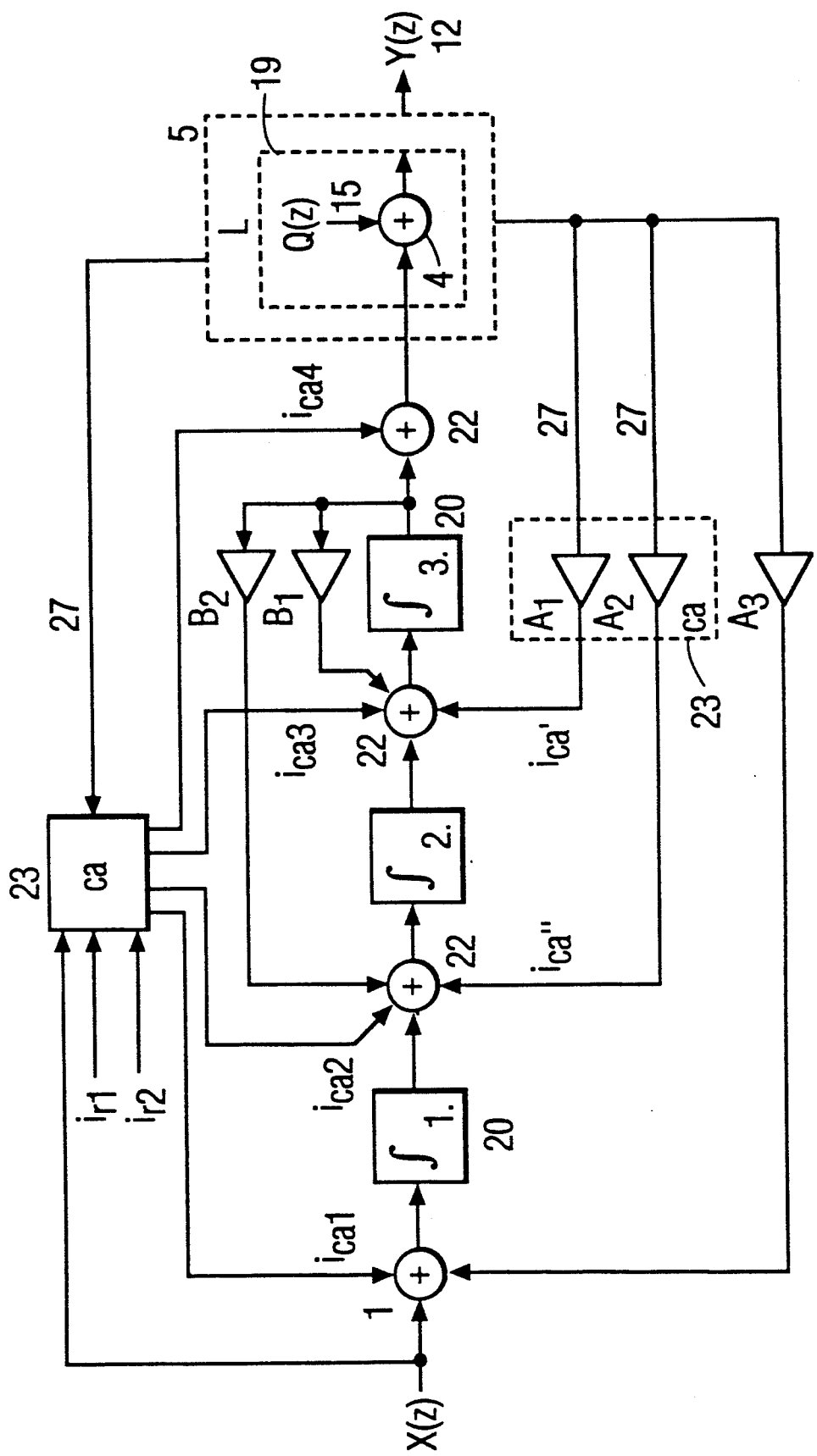

As an example for transposition of a third order analog-to-digital converter, the preferred implementation example of FIG. 13 shows the transposition of FIG. 7a. The new convergence accelerating signals $i'_{ca}$ and $i''_{ca}$ thereby appear which are again applied from one or several sources for convergence accelerating signals 23 of the kind defined above, in particular signals which are proportional to the applied reference signals 10 and/or 11 coming from the switching circuit 7 (see FIG. 1 and FIG. 4b). Here the branches $A_1$ to $A_3$ can be transposed exactly according to Mason, but this is not conveniently possible for the branches with $B_1$ and $B_2$ chosen in FIG. 7a, because then a feedback into the first integrator 20 of the charge storage or charge summation circuit 2, falsifying the input signal X(z), would take place. The different location of the branches with $B_1$ and $B_2$, in the sense of the transposition, implies a slightly different positioning of the zero points, but essentially almost the same noise transfer function $H_q(z)$ as according to FIG. 7a.

In an Nth order converter, the charge storage or charge summation circuit can consist, for example, of a cascaded combination of N (N=1, 2, 3, ...) integrators as in FIG. 2a for the solutions with single downward integration described above, whereby the individual outputs of the integrators, added together with different weighting factors, constitute the output signal of the charge storage or charge summation circuit which is the input signal for the comparator. The transposition theorem gives therefrom a circuit consisting of N integrators, but in which now at periodically recurrent time intervals a first reference signal is switched on and a second already connected reference signal is switched off with the aid of the logic circuit at each one of the N integrators individually and with the corresponding weighting factors $A_i$ with which the individual integrator outputs were added together in the original circuit to give the comparator input signal. Appropriately the $A_i$ are thereby normalized such that $A_N=1$. The other $A_1$ to $A_{N-1}$ then constitute the magnitude of the convergence accelerating signals $i'_{ca}$ to $i^{(N-1)}_{ca}$, the latter in case the original structure to be transposed already contained convergence accelerating signals. As soon as the output voltage of the Nth integrator has crossed the comparator switching threshold, the logic circuit evaluating the comparator output signal causes the weighted first reference signals to be switched off again and the second reference signals to be switched on again on the next edge or with a predefined delay after the next edge at the output of a clock oscillator. Here too the first or the second reference signal can be zero in simple versions of the invention.

The transposition theorem can also be applied to parts of a circuit of the form described above with single downward integration, giving circuits with Nth order noise shaping and N-M integrator inputs (N greater than or equal to M greater than or equal to one), in which reference signals are switched. Furthermore, in other preferred embodiments, all or parts of the charge storage or charge summation circuit 2 can be provided as electromechanical and/or mechanical and/or as opto-electromechanical stage(s) with transfer functions corresponding to those specified in this invention, in particular with regard to shaping of the quantization noise. In such cases, the time integrals of the considered variables or signals must be taken, instead of charges, for the quantitative considerations.

Various changes are possible within the scope of the inventive concept. For example, features of one embodiment may be combined with features of another embodiment.

Specification of Circuits
(Alternatives to integration into an IC)

| Component | Model No. and Supplier |
|---|---|
| Charge Summation Ckt. 2 | OP-77E manufactured or sold by Precision Monolitics Inc. with its output fed back to its inverting input by a capacitor |
| Comparator Ckt. 3 | LM311 manufactured or sold by National Semiconductor Corp. |
| Logic or µC Ckt. 5 | any model of a programmable micro processor. |
| Clock Osc. 6 | model no. SG-615/615P manufactured or sold by Seiko Epson Corp., Japan |
| Switching Ckt. 7 | DG308A manufactured or sold by Siliconix Corp. |
| Conv. Acc. Signal Source 23 Inverting Integrator | see U.S. Pat. No. 5,066,955 OP-77E manufactured or sold by Precision Monolitics Inc. with its output fed back to its inverting input by a capacitor |
| Integrators 20, 21 | OP-77E manufactured or sold by Precision Monolitics Inc. with its output fed back to its inverting input by a capacitor plus a second OP-77E together with two resistors forming an inverter (cf. FIG. 2b) |
| Sum/Difference Ckt. 22 | OP-77E manufactured or sold by Precision Monolitics Inc. with their output fed back to their inverting input by a resistor (cf. FIG. 2b) |
| Virtual Quantizer 19 | any comparator with its output connected to the D Input of a clocked D-Flip-Flop |
| Charge Pump Ckt. | LTC 1043 manufactured or sold by Linear Technology |
| 1st/2nd Digital Filter 24/25 | IM29C128 manufactured or sold by Intersil or any programmable µC |
| Digital Signal Proc. 8 | TMS320C14 manufactured or sold by Texas Instruments |
| Decimator 35 | part of 1st/2nd digital filter 24/25 |
| Differentiators 36–39 | part of 1st/2nd digital filter 24/25 |

What is claimed is:

1. An analog to digital converter according to a multiple-ramp procedure for performing continuous integration of an input signal (9) applied thereto, comprising a summation circuit (1) having a first input connected to said input signal (9);

a charge storage circuit (2) having an input connected to an output of said summation circuit (1), a comparator circuit (3), with a switching threshold, having an input connected to an output (13) of the charge storage circuit (2), and generating a comparator output signal (16);

a logic circuit (5) evaluating said comparator output signal, at least two analog switching control lines (17) connected to respective outputs of said logic circuit (5);

a clock oscillator (6) applying a clock signal (14) to an input of said logic circuit (5); and a switching circuit (7) applying, as an input signal to said charge storage circuit (2), at least one of a first reference signal (r1) and a second reference signal (r2), as determined by control inputs connected via said analog switching control lines (17) to said respective outputs of said logic circuit (5), wherein said comparator circuit (3) responds to an input signal (13) which crosses its switching threshold by producing a comparator output signal which triggers cessation of application of a currently applied one of said reference signals (r1,r2) and, at a predefined time with respect thereto, resumption of application of a different one of said reference signals (r1,r2), said triggering occurring in said logic circuit (5) at periodically recurrent time intervals at an edge of said clock oscillator output signal (14);

said logic circuit (5) generates an output signal (12), corresponding values of said summation circuit input signal (9) and said logic circuit output signal (12) collectively defining a transfer function H(z) of said analog-to-digital converter;

wherein, whenever at least one of said first and second reference signals (r1,r2) is zero, said transfer function H(z) has an Nth order, N≧1, low-pass filter characteristic; 'those instants when one of said reference signals is applied to said summation circuit (2) are defined as a "switched-on state" and said reference signal, and the duration of the switched-on state of the reference signal in a settled-down state and neglecting quantization noise, is a linear function of the input signal (9), and wherein a quantization noise transfer function $$H_q(z) = 1/(1 + H(z))$$

has a high-pass filter characteristic, thereby achieving greatest possible suppression of quantization noise in the frequency range of the input signal (9) being converted in said analog-to-digital converter.

2. Analog-to-digital converter according to claim 1, wherein
the transfer function of the quantization noise $H_q(z)$ has a high-pass filter characteristic of N>1.

3. Analog-to-digital converter according to claim 2, wherein
the transfer function of the quantization noise $H_q(z)$ has a Butterworth high-pass filter characteristic.

4. Analog-to-digital converter according to claim 2, wherein
the transfer function of the quantization noise $H_q(z)$ has a Tschebyscheff high-pass filter characteristic.

5. Analog-to-digital converter according to claim 2, wherein
the transfer function of the quantization noise $H_q(z)$ has a Cauer high-pass filter characteristic.

6. Analog-to-digital converter according to claim 2, wherein
the transfer function of the quantization noise $H_q(z)$ has a second order high-pass filter characteristic in the form of a twofold differentiating circuit.

7. Analog-to-digital converter according to claim 2, wherein
the transfer function of the quantization noise $H_q(z)$ has a second order high pass filter characteristic in the form of a twofold differentiating circuit with additional proportional components.

8. Analog-to-digital converter according to claim 1, wherein
convergence accelerating signals whose Taylor series expansions according to time in the time interval of a sub-measurement are first- or higher-order polynomials, are applied from a source for convergence accelerating signals (23) in the charge storage circuit.

9. Analog-to-digital converter according to claim 1, wherein
in the storage circuit (2), convergence accelerating signals whose Taylor series expansions according to time in the time interval of a sub-measurement are polynomials of at least the first order, are applied from at least one source for convergence accelerating signals (23).

10. Analog-to-digital converter according to claim 1, wherein
the duration of the switched-on state of each reference signal is determined by directly counting signal pulse edges (14) at the output of the clock oscillator (6).

11. Analog-to-digital converter according to claim 1, further comprising a digital signal processor (8) which further processes the result of the measurement of the duration of the switched-on state of each reference signal.

12. Analog-to-digital converter according to claim 1, further comprising a digital signal processor (8) which low-pass filters the result of the measurement of the duration of the switched-on state of each reference signal.

13. Analog-to-digital converter according to claim 1, further comprising a digital signal processor (8) which frequency-decimates the result of the measurement of the duration of the switched-on state of each reference signal.

14. Analog-to-digital converter according to claim 11, wherein said digital signal processor is a Texas Instruments TMS320C14.

* * * * *